(12) United States Patent
Kennett et al.

(10) Patent No.: US 9,134,614 B2
(45) Date of Patent: Sep. 15, 2015

(54) PHOTOIMAGING

(75) Inventors: Jonathan Kennett, Glasgow (GB); John Cunningham, Glasgow (GB); Robert Gibson, Glasgow (GB)

(73) Assignee: Rainbow Technology Systems LTD, Glasgow (GB)

( * ) Notice: Subject to any disclaimer, the term of this patent is extended or adjusted under 35 U.S.C. 154(b) by 0 days.

(21) Appl. No.: 13/824,019

(22) PCT Filed: Nov. 11, 2011

(86) PCT No.: PCT/GB2011/052202
§ 371 (c)(1),
(2), (4) Date: Aug. 2, 2013

(87) PCT Pub. No.: WO2012/069807
PCT Pub. Date: May 31, 2012

(65) Prior Publication Data
US 2013/0316152 A1   Nov. 28, 2013

(30) Foreign Application Priority Data

Nov. 23, 2010   (GB) .................................. 1019874.5

(51) Int. Cl.
*G03F 7/20*   (2006.01)
*H05K 3/00*   (2006.01)
*H05K 3/06*   (2006.01)
*H05K 3/34*   (2006.01)

(52) U.S. Cl.
CPC ............ *G03F 7/2012* (2013.01); *G03F 7/2035* (2013.01); *H05K 3/0082* (2013.01); *H05K 3/064* (2013.01); *H05K 3/3452* (2013.01); *H05K 2203/0143* (2013.01); *H05K 2203/107* (2013.01); *H05K 2203/1545* (2013.01); *Y10T 428/24802* (2015.01)

(58) Field of Classification Search
CPC ..... H01L 21/02639; C08L 23/16; B41C 1/05; B41C 1/1008; B41C 2210/04; B41C 2201/02; B41C 2210/12; G03F 7/00; G03F 7/2012
USPC ..................... 430/322, 311; 355/18
See application file for complete search history.

(56) References Cited

U.S. PATENT DOCUMENTS

| | | | |
|---|---|---|---|
| 4,056,423 A | 11/1977 | Hughes | |
| 4,530,306 A | 7/1985 | Hovekamp | |
| 2009/0020315 A1* | 1/2009 | Dutton | 174/250 |
| 2010/0035163 A1 | 2/2010 | Kobrin | |
| 2011/0159430 A1* | 6/2011 | Miyasaka et al. | 430/270.1 |

FOREIGN PATENT DOCUMENTS

| | | |
|---|---|---|
| JP | 56 064344 A | 6/1981 |
| JP | 60 205452 A | 10/1985 |
| JP | 2001 188354 A | 7/2001 |
| JP | 2006 285258 A | 10/2006 |
| WO | 02/067058 A1 | 8/2002 |
| WO | 2009/050141 A1 | 4/2009 |

OTHER PUBLICATIONS

International Search Report for PCT Application No. PCT/GB2011/052202 dated May 30, 2012.

\* cited by examiner

*Primary Examiner* — Caleen Sullivan
(74) *Attorney, Agent, or Firm* — David Bradin

(57) ABSTRACT

There is herein described a method and apparatus for photoimaging. More particularly, there is described a method and apparatus for photoimaging a substrate (e.g. a web) covered with a wet curable photopolymer wherein a rotatable phototool is pressed and rotated against the substrate to create an imaged substrate which is used to form images suitable for forming electrical circuits such as for printed circuit boards (PCBs), flat panel displays and flexible circuits. There is also described a method and apparatus for directly photoimaging a substrate covered with a wet curable photopolymer, wherein the photoimaged substrate is used to form images such as electrical circuits and a method and apparatus for exposing at least part of a solder mask on a printed circuit board (PCB) using a wet curable photopolymer wherein an imaging process may thereafter occur on the area above the solder mask.

26 Claims, 15 Drawing Sheets

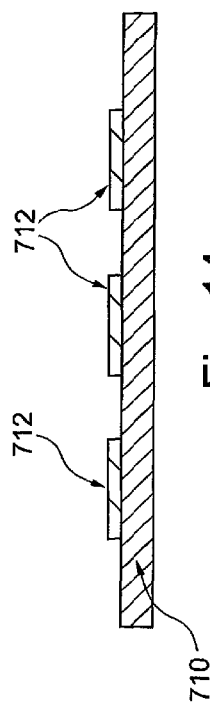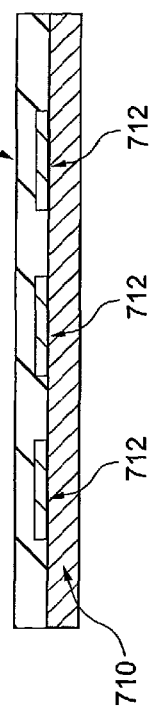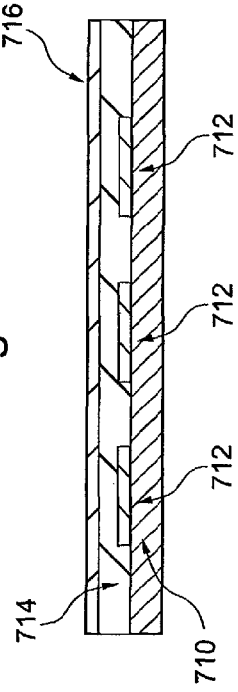

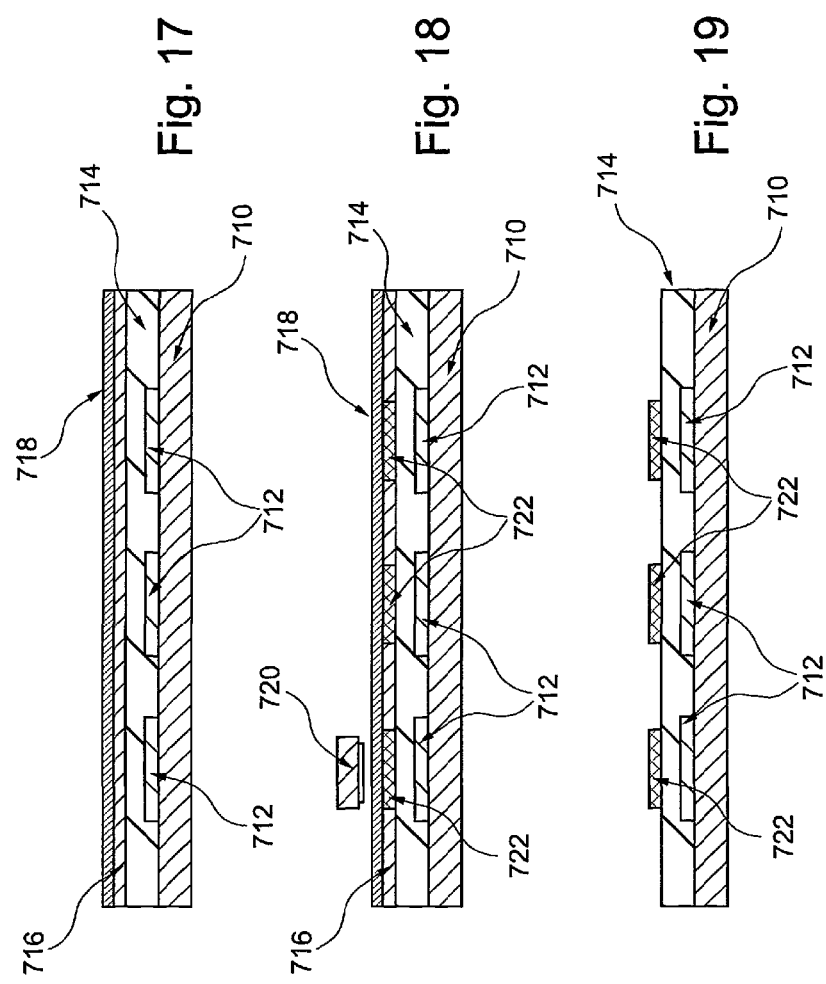

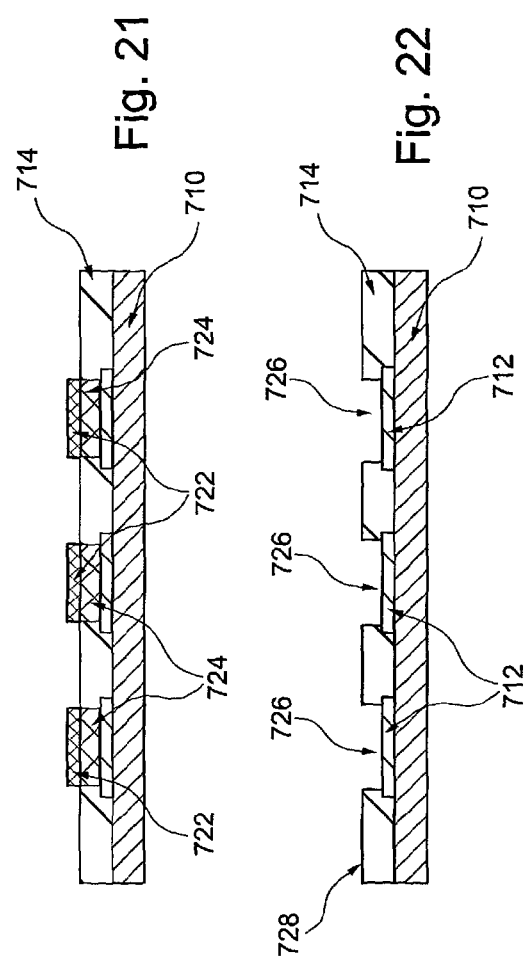

PHOTOIMAGING

CROSS-REFERENCE TO RELATED APPLICATIONS

This application is a U.S. national phase under the provisions of 35 U.S.C. §371 of International Patent Application No. PCT/GB11/52202 filed Nov. 11, 2011, which in turn claims priority of United Kingdom Patent Application No. 1019874.5 filed Nov. 23, 2010. The disclosures of such international patent application and United Kingdom priority patent application are hereby incorporated herein by reference in their respective entireties, for all purposes.

FIELD OF THE INVENTION

The present invention relates to a method and apparatus for photoimaging a substrate. More particularly, the present invention relates to a method and apparatus for photoimaging (e.g. directly) a substrate such as a web covered with a liquid curable photopolymer wherein a rotatable phototool is pressed and rotated against the substrate to create an imaged substrate which is used to form images suitable for forming electrical circuits such as for printed circuit boards (PCBs), flat panel displays and flexible circuits. The present invention also relates to a method and apparatus for imaging and exposing at least part of a solder mask. More particularly, the present invention relates to a method and apparatus for imaging and exposing at least part of a solder mask on a substrate such as a printed circuit board (PCB) using a wet curable photopolymer wherein an imaging process may thereafter occur on the area above the solder mask.

BACKGROUND OF THE INVENTION

Although prior techniques exist in the art for producing thin lines suitable for forming electrical circuits such as PCBs, many of these techniques suffer from a number of significant disadvantages. For example, many previous techniques suffer from poor resolution. Moreover, techniques which do provide high resolution usually require complex apparatus. A further problem is that previous techniques have required the use of dry films of photopolymer which are usually supported on a polyester (e.g. Mylar) film. The thickness of these dry films has a detrimental effect on the resolution and/or definition of photoimaged surfaces as this allows unwanted undercutting (i.e. light shadowing) to occur during the photoimaging process. There are also problems in adhering partially cured dry films to substrates and contamination problems which once again causes problems in the photoimaging process. Dry films are also expensive when used in large quantities. Such systems are described in U.S. Pat. No. 4,888,270 and U.S. Pat. No. 4,954,421, which are incorporated herein by reference.

At the present time the market for printed circuit imaging may be identified as having two separate types of resist:

(1) Wet resist which is coated on a panel by a variety of means and then pre-dried with hot air to drive off the solvents. This leaves a 'dry' surface which is photo-imageable using UV light. The raw materials for wet resist are inexpensive but processing costs (heat etc) substantially add to the overall cost of using a wet resist.

(2) Dry film resist which starts out as a liquid coating that is pre-dried and supplied sandwiched between two layers of protective film. The user laminates the dry film to a copper panel using heat and pressure. In the process the protective films are removed which requires labour and presents a landfill issue at disposal.

In the prior art both wet resist and dry film resist are exposed using UV light, either by photolithography or by laser direct imaging (LDI).

Today there is an increasing use of UV cured inks in the printing industry. This is because the avoidance of solvents is attractive from an environmental standpoint. It has been customary to use high powered lamps such as mercury discharge lamps to cure the wet ink immediately after it is printed on a moving web of material. However, such lamps consume large amounts of electrical power, generate significant amounts of unwanted heat and also create ozone which needs extraction. Although these types of lamps consume large amounts of power the amount of usable UV energy is a small percentage of the overall output.

By contrast, UV LED's have a much higher output percentage of UV compared to mercury halide filled tubes. They do not create ozone and heat dissipation is minimal and they do not require large bulky ducting. In addition, since the mercury halide lamps do not re-strike immediately when they are switched off then back on again, they have to be left running on partial power even though the line may have stopped for some reason. This involves further heat management as the output from the mercury halide lamp has to be contained usually with shutters which get very hot.

Again, using LED's which have more or less instant start up saves wasted power on standby and overall electrical power used with LED's is a fraction of that used with conventional mercury halide lamps.

The one weakness of LED's is that they produce significantly lower levels of overall UV power albeit they are efficient at what they do. This means that a printer seeking to use LED's for curing will typically have to run their line slower to allow longer time for the ink to cure.

One reason for slow cures is a phenomenon known as oxygen inhibition whereby the presence of air at the cured surface interferes with the tendency for the ink to cure under UV light. To get round this, some printers create an atmosphere of inert gas (e.g. nitrogen) in the curing area which effectively prevents oxygen from interfering with the process. This is an expensive means to an end.

We also hereby refer to WO2010/007405, incorporated herein by reference, which refers to using a resist that is different to pre-dated prior art resists in that it is made up of 100% solids so has no solvents involved in the related processing. In this process, the ink is coated on a panel but is not pre-dried prior to imaging but is sandwiched under a layer of clear film. During exposure to UV light the resist hardens in the exposed areas only. After imaging, the protective polyester is peeled off for re-use and the unexposed (liquid) resist is washed off the panel. The resist in WO2010/007405 can also be exposed using either photolithography or laser direct imaging (LDI). WO2010/007405 also solely relates to using a fixed and non-rotatable phototool.

The outside surface of a printed circuit board (PCB) is usually covered with a protective insulative layer which assists soldering by confining it to specific areas such as electrical components or pads. As components and circuitry size decreases the need for accurate registration of the solder mask is becoming increasingly important. The need is to apply the same imaging accuracy using laser direct imaging (LDI). However, the solder mask can be relatively thick (e.g. 75 microns) so exposure using a laser is a slow job. As lasers are expensive to buy and operate it is a major commercial decision for a manufacturing company to make this extra investment.

We also hereby refer to WO2010/007405, incorporated herein by reference, which refers to using a photopolymer that is different to pre-dated methods in that it is made up of 100% solids so has no solvents involved in the related processing. In WO2010/007405, the ink is coated onto a panel but is not pre-dried prior to imaging and is sandwiched under a layer of polyester or other UV transparent material. During exposure to UV light the photopolymer hardens in the exposed areas only. After imaging, the protective polyester is peeled off for re-use and the unexposed (liquid) photopolymer is washed off. The photopolymer in WO2010/007405 can also be exposed using either photolithography or laser direct imaging (LDI). WO2010/007405 also solely relates to the exposure of the photopolymer using a phototool.

It is an object of at least one aspect of the present invention to obviate or mitigate at least one or more of the aforementioned problems.

It is a further object of at least one aspect of the present invention to provide an improved method for photoimaging surfaces.

It is a yet further object of at least one aspect of the present invention to provide a cost efficient method for producing electrical circuits with high resolution and small track widths (i.e. fine lines).

It is a further object of at least one aspect of the present invention to provide a cost efficient method for producing high density electrical circuits suitable for PCBs, flat panel displays and flexible circuits.

It is a further object of at least one aspect of the present invention to provide an improved method for photoimaging surfaces with high resolution and small track widths over a large area.

It is a further object of at least one aspect of the present invention to provide an improved method for exposing at least part of a solder mask.

SUMMARY OF THE INVENTION

According to a first aspect of the present invention there is provided a method for photoimaging a substrate, said method comprising:
    providing a substrate;
    depositing a liquid photopolymer onto at least part of the substrate to form a layer of liquid photopolymer on the substrate;
    providing a rotatable phototool; and
    rotating the phototool against the liquid film of photopolymer on the substrate; wherein an imaged pattern of cured photopolymer is formed on the substrate.

The present invention therefore relates to using a rotatable phototool to image a substrate by pressing and rotating the phototool against the liquid film of photopolymer on the substrate. The liquid wet film of photopolymer on the substrate may therefore be partially wrapped around and rotated against the phototool which has the effect of eliminating or removing any air (including oxygen) between the liquid film of photopolymer and the phototool through which radiation is transmitted.

In the present photoimaging process there is also no pre-drying prior to the actual imaging process—this is in contrast to prior art processes. The improved photoimaging process is based on the principle that liquid photopolymer (i.e. printable ink which can be imaged and cured) is not pre-dried prior to imaging and a rotatable process is used which allows reel to reel continuous process to be used. The parts of the photopolymer which are imaged are hardened and can then be used to form electrical circuitry. The photopolymer which is unexposed remains in liquid form can then be washed off.

The substrate may be in the form of a web and may, for example, comprise a dielectric or non-metallic layer (e.g. a film) made from a plastics material such as polyester (e.g. Melinex—Trade Mark), polyimide (e.g. Kapton—Trade Mark) and polycarbonate (e.g. Lexan—Trade Mark). The substrate may be flexible to allow a reel to reel process to occur. On top of the plastics material there may be a further layer which may be in the form of a cladding. The cladding may be made from a conductive material such as copper, silver, gold and the like, or conductive polymers such as PDET, ITO or Graphene.

The liquid photopolymer may be deposited using any suitable technique (e.g. flexo/screen/letterpress/gravure/roller) such as using a roller unit comprising coating rollers and optionally a doctor blade to control the rate of deposition of the liquid photopolymer. However, the liquid photopolymer may be deposited using any other method such as using a spray, a brush, a roller and/or a dip coating system.

Prior to application of the liquid photopolymer, the substrate may be cleaned using a contact cleaning process to remove debris and/or contamination from the surface of the substrate.

The liquid photopolymer may be made up of 100% solids and contain no solvent. Typically, the liquid photopolymer may be deposited with a thickness according to any of the following: less than or equal to about 150 µm; less than or equal to about 125 µm; less than or equal to about 100 m; less than or equal to about 75 µm; less than or equal to about 50 µm; less than or equal to about 25 µm; less than or equal to about 10 µm; less than or equal to about 5 µm; less than or equal to about 1 µm; less than or equal to about 0.5 µm or less than or equal to about 0.1 µm. Alternatively, the liquid photopolymer may be deposited with a thickness ranging from any of the following:
    about 177 µm to about 0.1 µm; about 125 µm to about 0.1 µm; about 100 µm to about 0.1 µm; about 75 µm to about 0.1 µm; about 50 µm to about 0.1 µm; about 25 µm to about 0.1 µm or about 10 µm to about 0.1 µm. Preferably, the liquid photopolymer may have a thickness of about 5 microns.

The use of thin liquid photopolymer films allows low intensity radiation (e.g. UV light) to be used in the photoimaging process.

The substrate which is coated with the liquid photopolymer may be pressed and rotated against the outer surface of the rotatable phototool using a series of rollers. The rotatable phototool may be in the form of a rotating drum. The phototool creates an image on each revolution and may therefore operate in a continuous manner. The rotating and pressing of the liquid photopolymer on the substrate has the specific advantage of removing any air (and hence oxygen) between the part of the phototool being pressed against the liquid photopolymer. This improves the imaging process and allows for a continuous process to occur.

The rotatable phototool may comprise a clear and, in particular, a UV transparent/translucent tubular structure which may be made from, for example, glass (e.g. pyrex glass), quartz or any other suitable UV transparent/translucent material. At the center (or substantially the center) of the phototool there may be a UV light source which is capable of emitting UV light, for example, within the confines of an internal light baffle. The UV light source may be a UV lamp or preferably an LED (e.g. an array of LEDs). Any other type of radiation may also be used. The phototool may be tensioned using a tensioner around the UV transparent/translucent tubular structure.

The outside surface of the phototool may be coated with a protective slip coat to prevent the ink sticking to its surface once cured.

Typically, the phototool may be a rotatable drum which may rotate at the speed of the substrate fed in so as not to distort the printed image. The ink (i.e. the liquid photopolymer) is cured during the short time the substrate is in contact with the rotating phototool.

The liquid wet photopolymer may therefore be imaged by the UV light source. The UV radiation may have a wavelength of about 200-400 nm (e.g. about 395 nm) and may have an intensity matched to cure the exposed liquid photopolymer layer. The photoimaging process is extremely quick as no air and oxygen is trapped under the liquid photopolymer layer. A particularly preferred UV light source may be UV LEDs as they produce very small amounts of heat, have a long working life, start up immediately, have substantially no fall-off in power output, are low maintenance and can produce high levels of UV light intensity. LEDs may therefore be used to print fine lines in an inexpensive photoimaging process according to the present invention. An alternative light source may be a laser light source.

After curing the substrate may then pass over a roller and be conveyed to, for example, a developer unit. In particular embodiments of the present invention, the radiation may be collimated to improve the quality and/or resolution and/or definition of the photoimaging process.

The substrate may have a cured image and a residual wet coating (i.e. the area that is not imaged with UV light). After the photoimaging process, liquid photopolymer which has not been exposed to UV radiation may be removed using, for example, an aqueous alkali solution via a washing procedure. A standard chemical etching process may then be used. For example, acid or alkali may be used to produce a dielectric substrate clad with the required metal (e.g. copper) circuitry covered by polymerised photopolymer. The polymerised photopolymer can then be removed to yield a substrate with the required electrical conductive circuitry.

The apparatus as described in the present invention can also be fully contained in a mini-clean room which therefore provides significant cost savings in the photoimaging process.

Using the method as described in the present invention high definition fine lines suitable for electrical circuitry are obtained. The fine lines have a width of any of the following: less than or equal to about 200 µm; less than or equal to about 150 µm; less than or equal to about 140 µm; less than or equal to about 130 µm; less than or equal to about 120 µm; less than or equal to about 110 µm; less than or equal to about 100 µm; less than or equal to about 90 µm; less than or equal to about 80 µm; less than or equal to about 75 µm; less than or equal to about 70 µm; less than or equal to about 60 µm; less than or equal to about 50 µm; less than or equal to about 40 µm; less than or equal to about 30 µm; less than or equal to about 20 µm; less than or equal to about 10 µm; or less than or equal to about 5 µm. Alternatively the fine lines have a width of any of the following: greater than about 200 µm; greater than about 150 m; greater than about 100 µm; greater than about 75 µm; greater than about 50 µm; greater than about 20 µm; or greater than about 10 µm. Alternatively the fine lines have a width of any of the following: about 0.1-200 µm; about 1-150 m; about 1-100 µm; about 20-100 µm or about 5-75 µm.

The process in the present invention may be used to form a variety of electronic components including that of printed circuit boards (PCBs), flat panel displays and flexible circuits suitable for the electronics market.

The method may also comprise multiple coating heads and rotating drums.

The present invention therefore relates to a method of photoimaging a substrate covered with a liquid curable photopolymer (i.e. a wet resist), wherein the photoimaged substrate may be used to form electrical circuits such as PCBs, flat panel displays and flexible circuits e.g. LCD TV's. The present invention may also relate to forming conductive images on dielectrics. In contrast to many prior art techniques, the present invention therefore relates to the use of wet films rather than expensive dry films such as Riston (Trade Mark). Dry films are considerably more expensive than the use of wet films. The use of wet films also overcomes the need for pre-drying of the dry films and therefore leads to a very controllable process.

Using the method as described in the present invention, high definition fine lines suitable for electrical circuitry may be obtained. The fine lines may have a width of any of the following: less than or equal to about 200 µm; less than or equal to about 150 µm; less than or equal to about 140 µm; less than or equal to about 130 µm; less than or equal to about 120 µm; less than or equal to about 110 µm; less than or equal to about 100 µm; less than or equal to about 90 µm; less than or equal to about 80 µm; less than or equal to about 75 µm; less than or equal to about 70 µm; less than or equal to about 60 µm; less than or equal to about 50 µm; less than or equal to about 40 µm; less than or equal to about 30 µm; less than or equal to about 20 µm; less than or equal to about 10 m; or less than or equal to about 5 µm. Alternatively the fine lines may have a width of any of the following: about 0.1-200 µm; about 1-150 µm; about 1-100 µm; about 20-100 µm or about 5-75 µm. The fine lines may be used in PCBs and other electrical components such as flat screen displays.

The method of the present invention may have the added advantage in that all steps such as the deposition of the liquid photopolymer and the photoimaging may occur in a single pass through the apparatus. This one-step process therefore increases the throughput of photoimaged substrates through the apparatus and also provides an apparatus which is easy to control and monitor.

The apparatus of the present invention has a number of advantages such as: (a) The use of LED's instead of Mercury halide lamps—saves large amounts of power and reduces heat output dramatically. LED's are more compact and have instant start up.

(b) The apparatus allows the line speed of equipment to be increased many fold thus improving production output. The effectiveness of an LED system can be increased by possible factors of 10. This allows LEDs to be used where previously the output was too low to effect cure at a reasonable line speed.

According to a second aspect of the present invention there is provided photoimaged substrates formed according to the first aspect.

The photoimaged substrates may be used to form photoimaged circuits.

Typically, the photoimaged circuits may be electrical circuits which may be used in the manufacture of, for example, PCBs, flat panel displays and flexible circuits.

According to a third aspect of the present invention there is provided a method for imaging a substrate, said method comprising:

providing a substrate;

depositing a liquid wet photopolymer onto at least part of the substrate to form a layer of liquid wet film of photopolymer on the substrate;

applying a protective film onto the layer of liquid wet film of photopolymer on the substrate;

using a direct imaging unit; and directly applying radiation from the direct imaging unit onto the liquid wet photopolymer through the protective film;

wherein an imaged pattern of cured photopolymer is formed on the substrate.

The present invention therefore relates to a method of photoimaging a substrate covered with a wet curable photopolymer (i.e. a wet resist), wherein the photoimaged substrate may be used to form electrical circuits such as PCBs, flat panel displays and flexible circuits. The present invention may also relate to forming dielectric images on dielectrics. In contrast to many prior art techniques, the present invention therefore relates to The use of 100% solids wet films rather than expensive dry films such as Riston (Trade Mark). Dry films are considerably more expensive than the use of wet films. The use of 100% solids wet films also overcomes the need for pre-drying of the wet films and therefore leads to a very controllable process.

In the present invention there is no pre-drying step before the film of wet photopolymer is imaged and irradiated with, for example, UV radiation. This is in complete contrast to prior art techniques which pre-dry a wet film before irradiation occurs.

Typically, the present invention resides in the provision of an improved photoimaging process wherein direct imaging is used and where no phototool is required. There is also no pre-drying step prior to the actual imaging process which occurs on the liquid wet resist (i.e. printable ink which can be imaged and cured).

The substrate may be of any flexible material and may be made from a conductive material such as copper, silver, gold and the like, or conductive polymers such as PDET, ITO or Graphene. Alternatively, the substrate may be made from non-metallic material or dielectric material.

In optional embodiments, the substrate may comprise a cladding which may comprise or consist of conductive material.

The substrate may have a liquid wet photopolymer deposited onto one or both sides of the substrate. In embodiments where there is a liquid wet photopolymer on both sides of the substrate then a protective film is also deposited onto both layers of liquid wet photopolymer. The liquid wet photopolymer is deposited and remains in a wet form (i.e. in a flowable form) until imaging. The chemical properties of the liquid photopolymer may be matched to the required curing properties.

The liquid wet photopolymer on one or both sides of the substrate is imaged directly with one or two direct imaging units i.e. no phototool is used. The liquid wet photopolymer is therefore imaged using a direct writing process using any suitable light imaging device e.g. a laser direct imaging (LDI) unit or any other suitable digital light imaging device. Typically, UV light may be used.

The parts of the liquid wet photopolymer which are imaged are hardened and may then be used to form, for example, electrical circuitry.

Once the imaging has occurred, the protective film on one or both sides of the substrate may then be removed. The photopolymer which is unexposed remains in liquid form and may be washed off in a washing process. One or both sides of a substrate are therefore capable of being simultaneously imaged using this process.

Prior to the imaging of the liquid wet photopolymer in the direct writing process and after the deposition of the film or films onto the liquid wet photopolymer there may be an intermediate process where a curing process occurs which forms a frame, border and/or perimeter of cured photopolymer around a region of uncured liquid wet photopolymer. The uncured liquid wet photopolymer may therefore be sealed within the frame (e.g. similar to a picture frame) of outer cured photopolymer to form sealed panels. During the sealing process the protective film may be sealed to the cured photopolymer and be adjacent to and abut against the uncured liquid wet photopolymer. This prevents any air and oxygen between the liquid wet photopolymer and the protective film. The sealed region may be about 12-15 mm. The sealed panels may be single discrete units such as a single mobile panel (e.g. a packet) or a series of sealed panels which can be formed using a continuous reel of clear film (e.g. polyester film) which provides a sealed packet and a method of moving the panel along—conveyor style.

The sealed frame, border and/or perimeter of cured photopolymer may therefore be formed during a pre-exposure stage using any suitable radiation source (e.g. a UV radiation source) that is capable of curing the liquid wet photopolymer and forming a pocket of uncured liquid wet photopolymer. Light emitting diodes (LEDs) may be used to form the sealed frame, border and/or perimeter of cured photopolymer. During this pre-exposure stage the substrate may be supported on both upper and lower surfaces by a clear (or substantially clear) film layer of, for example, polyester.

The uncured wet liquid photopolymer in the central area of the panel may be imaged with a low power of about 0.5-2 mJ and typically about 1-2 mJ or more particularly about 1.8 mJ. The use of thin wet liquid photopolymer films allows low intensity radiation (e.g. UV light) to be used in the photoimaging process.

The radiation used to cure the wet liquid photopolymer may be any suitable radiation which cures the liquid photopolymer. In particular embodiments, UV radiation may be used to polymerise and/or harden and/or set the exposed liquid (e.g. wet) photopolymer. The UV radiation may have a wavelength of about 200-400 nm and may have an intensity matched to cure the photopolymer being used (e.g. about 395 nm). A particularly preferred UV light source may be UV LEDs as they produce very small amounts of heat, have a long lamp life, start up immediately, have substantially no fall-off in power output, are low maintenance and can produce high levels of light intensity. LEDs may therefore be used to print fine lines in an inexpensive photoimaging process according to the present invention. An alternative light source may be a laser light source.

In particular embodiments of the present invention, the radiation may be collimated to improve the quality and/or resolution and/or definition of the photoimaging process.

After imaging the image may be developed in developing solution such as a carbonate solution. The layers of film may then be removed using a reel process and wet photopolymer which has not been imaged and hardened may then be washed away.

The wet liquid photopolymer may be deposited using any suitable technique to only one or both first and second sides of the substrate. The present invention may therefore relate to a single-sided or a double-sided exposure in, for example, a front to back registration.

The wet liquid photopolymer may be deposited in a substantially even and continuous manner using any suitable technique. For example, the wet liquid photopolymer layer may be deposited using a spray, a brush, a roller and/or a dip coating system. Preferably, the wet liquid photopolymer may be deposited using a series of rollers and optionally a doctor blade to control the thickness of the deposited wet liquid photopolymer layer.

Prior to application of the wet liquid photopolymer, the substrate may be cleaned using a contact cleaning process to remove debris and/or contamination from the surface of the substrate.

The wet liquid photopolymer may be made up of 100% solids and contain no solvent.

Typically, the wet liquid photopolymer may be deposited with a thickness according to any of the following: less than or equal to about 150 µm; less than or equal to about 125 µm; less than or equal to about 100 µm; less than or equal to about 75 µm; less than or equal to about 50 µm; less than or equal to about 25 µm; less than or equal to about 10 m; less than or equal to about 5 µm; less than or equal to about 1 µm; less than or equal to about 0.5 µm or less than or equal to about 0.1 µm. Alternatively, the liquid photopolymer may be deposited with a thickness ranging from any of the following: about 177 µm to about 0.1 µm; about 125 µm to about 0.1 µm; about 100 µm to about 0.1 µm; about 75 µm to about 0.1 µm; about 50 µm to about 0.1 µm; about 25 µm to about 0.1 µm or about 10 µm to about 0.1 µm. Preferably, the wet liquid photopolymer may have a thickness of about 5 microns.

The use of thin liquid photopolymer films allows low intensity radiation (e.g. UV light) to be used in the photoimaging process.

The film may be of any suitable UV transparent material but particularly may be made from polyester which may be optically or substantially optically clear. The film may also comprise a protective coating to aid chemical resistance, release from cured photopolymer and dimensional changes caused by excess humidity levels.

The process in the present invention may be used to form a variety of electronic components including that of printed circuit boards (PCBs), flat panel displays and flexible circuits.

The direct imaging process of the present invention may therefore use a UV transparent optically clear film to locate uncured liquid wet photopolymer within a cured frame over a panel to be imaged. The exposure in the present invention is remarkably quick and uses low levels of UV energy compared with standard photopolymers. Prior art standard resists (including other imageable layers like solder mask) require exposure of typically 50-80 mJ of energy to complete the cure (cross-linking). Some expensive dry films have been developed with exposure requirements as low as 8 mJ. By contrast the liquid wet photopolymer of the present invention can be exposed with only about 1.8 mJ of UV energy. The significance of this needs to be understood in terms of the improved productivity from direct imaging units (e.g. laser direct imaging units). The use of a direct imaging process also allows for small adjustments of the panel intended to be imaged to be moved slightly so that all imaged panels are exactly the same with no distortions caused by the stretching of the base substrate in a phototool. This cannot be achieved with standard lithographic systems.

The method of the present invention may also be self-contained in a mini-clean room which therefore provides significant cost savings in the photoimaging process as large industrial clean rooms are not required.

Using the method as described in the present invention, high definition fine lines suitable for electrical circuitry may be obtained. The fine lines may have a width of any of the following: less than or equal to about 200 µm; less than or equal to about 150 µm; less than or equal to about 140 µm; less than or equal to about 130 µm; less than or equal to about 120 µm; less than or equal to about 110 µm; less than or equal to about 100 µm; less than or equal to about 90 µm; less than or equal to about 80 µm; less than or equal to about 75 µm; less than or equal to about 70 µm; less than or equal to about 60 µm; less than or equal to about 50 µm; less than or equal to about 40 µm; less than or equal to about 30 µm; less than or equal to about 20 µm; less than or equal to about 10 m; or less than or equal to about 5 µm. Alternatively the fine lines may have a width of any of the following: about 0.1-200 µm; about 1-150 µm; about 1-100 µm; about 20-100 µm or about 5-75 µm. The fine lines may be used in PCBs and other electrical components such as flat screen displays.

The method of the present invention may have the added advantage in that all steps such as the deposition of the liquid photopolymer and the deposition and removal of the film may occur in a single pass through the apparatus. For example, the depositing of a liquid photopolymer on at least one or both sides of the substrate using a series of rollers, the deposition and removal of the film using a further series of rollers and the application of radiation to the liquid photopolymer to cure the photopolymer layer may all occur in a single pass through photoimaging apparatus of the present invention. This one-step process therefore increases the throughput of photoimaged substrates through the apparatus and also provides an apparatus which is easy to control and monitor.

The present invention is therefore based on a number of unique features:

1. Exposing wet photopolymer under a protective clear overlay (e.g. film).
2. Using a sealed border created using the same wet photopolymer as will later be used for imaging.
3. Transporting a panel by means of a clear film carrier (e.g. polyester film) which also doubles as part of the package being exposed.

The process of the present invention also allows for continuous processing (desirable for efficiency) whereas existing approaches comprise of fragmented manufacturing steps.

The present invention also has a number of advantages:

1. Big energy savings as no heat used to pre-dry the photopolymer.
2. Exposure is much faster due to exclusion of oxygen at the surface of the photopolymer because of the film protection. This results in very rapid throughput in a normally slow cycle direct imaging unit e.g. laser direct imaging (LDI) units. Laser direct imaging (LDI) units cost about £500 k-£1 m and time on them is costly.
3. Cost savings using liquid photopolymer compared to expensive dry films.
4. Due to thinness of liquid photopolymer (approx 5 microns) extremely fine detail can be printed. This favours laser imaging since operating at lower power (but quicker speeds) increases the accuracy of the image.

According to a fourth aspect of the present invention there is provided photoimaged substrates formed according to the first aspect.

The photoimaged substrates may be used to form photoimaged circuits.

Typically, the photoimaged circuits may be electrical circuits which may be used in the manufacture of, for example, PCBs, flat panel displays and flexible circuits.

According to a fifth aspect of the present invention there is provision for apparatus for photoimaging a substrate, said apparatus comprising:

a device capable of depositing liquid wet photopolymer onto a surface of the substrate to form a film of liquid wet photopolymer;

a means capable of delivering a protective film onto the film of liquid wet photopolymer;

a direct imaging unit capable of applying radiation onto the liquid wet photopolymer through the protective film and forming an imaged pattern of cured photopolymer on the substrate.

The photoimaging process may be as defined in the first aspect.

The device capable of depositing liquid wet photopolymer onto a surface of the substrate to form a film of liquid wet photopolymer may be in the form of a series of rollers with optional doctor blades to control the rate of photopolymer deposition.

The film may be deposited via a series of rollers.

The direct imaging unit may be a laser direct imaging (LDI) unit or any other suitable digital light imaging device.

After exposure the film may be removed using a further series of rollers.

The apparatus may also comprise pre-exposure radiation unit to perform a curing step which forms a frame, border and/or perimeter of cured photopolymer around a region of uncured liquid wet photopolymer. The pre-exposure radiation unit may comprise light emitting diodes (LEDs).

The apparatus may also be in the form of a reel to reel process where the film is delivered in a reel form, unwound to create a web onto which the liquid wet photopolymer is deposited then imaged using UV radiation. The web is then continued to a developing unit to wash off uncured wet photopolymer then to a rinse station before being dried and taken to a rewind station to be reformed back into a reel suitable for use in any subsequent processes.

According to a sixth aspect of the present invention there is provision for apparatus for photoimaging a substrate, said apparatus comprising:

a device capable of depositing liquid photopolymer onto a surface of a substrate to form a film of liquid photopolymer;

a rotatable phototool capable of allowing transmission of radiation onto the liquid photopolymer on the substrate;

conveying means capable of conveying the substrate comprising a film of liquid photopolymer pressed against the rotatable phototool;

wherein an imaged pattern of cured photopolymer is formed on the substrate.

The photoimaging method may be as defined in the first aspect.

The device capable of depositing liquid photopolymer onto a surface of the substrate to form a film of liquid photopolymer may be in the form of a series of rollers with optional doctor blades to control the film weight on deposition.

During the process the rotatable phototool may be pressed and rotated against the conveyed substrate.

The apparatus may also be in the form of a reel to reel process where the substrate is delivered in a reel form, the liquid photopolymer deposited and then imaged, with the imaged substrate then removed in a reel form.

According to a seventh aspect of the present invention there is provided a method for imaging, said method comprising:

providing a substrate with an exposed surface;

disposing electrical components on the exposed surface of the substrate;

overlaying the exposed surface of the substrate and the electrical components on the exposed surface of the substrate with a layer of solder mask;

depositing a liquid wet photopolymer onto the layer of solder mask to form a layer of liquid wet film of photopolymer;

applying a UV transparent or substantially UV transparent protective film onto the layer of liquid wet film of photopolymer;

providing a first imaging unit;

applying radiation from the first imaging unit through the protective film onto regions of the liquid wet photopolymer located above or substantially above the electrical components wherein the exposed regions of the liquid wet photopolymer are cured and hardened;

removing the protective film;

removing unexposed regions of the liquid wet film of photopolymer which remain uncured;

applying further radiation from a second imaging unit which cures the parts of the solder mask not covered by the cured part of the liquid wet photopolymer and acting as a photomask;

and then removing the cured and hardened wet polymer which acted as the photomask along with the uncured part of the solder mask underneath it which was protected from the 2nd stage of UV curing;

wherein channels or traces located above or substantially above the electrical components are capable of being formed.

The present invention therefore relates to a method of exposing part of a solder mask on a substrate (e.g. a printed circuit board) after first using a liquid wet curable photopolymer to coat the soldermask wherein an imaging process occurs on the area above the solder mask. In particular, the present invention resides in the provision of an improved imaging process wherein at least part of a solder mask on a printed circuit board (PCB) is masked using a first imaging stage (e.g. with a laser direct imaging unit) wherein a wet liquid photopolymer layer is cured to create an image on top of the soldermask and thereafter a second imaging stage is used to produce an image in the solder mask itself using the cured liquid photpolymer as a photomask. The present invention therefore relies on the deposition of a wet liquid photopolymer layer on top of a solder mask layer and then initially imaging the wet liquid photopolymer layer to create a photomask wherein the solder mask below can then be imaged with a second imaging stage.

The substrate may be a printed circuit board. Alternatively, the substrate may be any other planar structure which may be flexible and may be made from a conductive material such as copper, silver, gold, indium tin oxide (ITO) and the like. Alternatively, the substrate may be made from non-metallic material such as, Poly(Ethylene-DioxyThiophene) also known as PEDT, Polyaniline or polypyrrole or Graphene, or dielectric material.

The electrical components may be any type of standard electrical components in the form of pads. The electrical components may be attached to the substrate using any suitable means such as any form of adhesive and/or solder.

The solder mask may be deposited using any suitable means such as a spray, a brush, a roller and/or a dip coating system. The layer of solder mask is preferably continuous and may have a thickness of about 5 µm to about 75 µm. The solder mask may be made from any suitable material such as a polymerisable epoxy liquid.

The layer of liquid wet photopolymer may be deposited using any suitable means such as a spray, a brush, a roller and/or a dip coating system. The wet liquid photopolymer may be deposited in a substantially even and continuous manner using any suitable technique. The wet liquid photopolymer may be made up of 100% solids and contain no solvent.

Typically, the wet liquid photopolymer may be deposited with a thickness according to any of the following: less than or equal to about 150 µm; less than or equal to about 125 µm; less than or equal to about 100 µm; less than or equal to about 75 µm; less than or equal to about 50 µm; less than or equal to about 25 µm; less than or equal to about 10 m; less than or equal to about 5 µm; less than or equal to about 1 µm; less than or equal to about 0.5 µm or less than or equal to about 0.1 µm. Alternatively, the wet liquid photopolymer may be deposited with a thickness ranging from any of the following: about 177 µm to about 0.1 µm; about 125 µm to about 0.1 µm; about 100 µm to about 0.1 µm; about 75 µm to about 0.1 µm; about 50 µm to about 0.1 µm; about 25 µm to about 0.1 µm or about 10 µm to about 0.1 µm. Preferably, the wet liquid photopolymer may have a thickness of about 5 microns.

The use of thin wet liquid photopolymer films allows low intensity radiation (e.g. UV light) to be used in the photoimaging process.

The UV transparent or substantially UV transparent protective film may be any suitable flexible film. The film may be of any suitable material but particularly may be made from polyester which may be UV optically or substantially optically clear. Alternatively, the film may be UV translucent. The film may also comprise a protective coating to aid chemical photopolymer, release from cured photopolymer and dimensional changes caused by excess humidity levels.

The film removes (i.e. squeezes out) any air (including oxygen) adjacent the liquid wet photopolymer which can be detrimental to the photoimaging process. In the present invention there is also no pre-drying step before the film of wet photopolymer is imaged and irradiated with, for example, UV radiation. This is in complete contrast to prior art techniques which pre-dry a wet film before imaging occurs.

Typically, the present invention resides in the provision of an improved photoimaging process wherein direct imaging is used and where no phototool is required. There is also no pre-drying prior to the actual imaging process which occurs on the liquid wet photopolymer (i.e. printable ink which can be imaged and cured).

The first and second imaging units may be a direct imaging unit e.g. a laser direct imaging (LDI) unit or any other suitable digital light imaging device. Typically, UV light may be used but visible light or other wavelengths of electromagnetic radiation may also be used. The parts of the liquid wet photopolymer which are imaged by the first imaging unit are hardened. The radiation used to cure the wet liquid photopolymer may be any suitable radiation which cures the liquid photopolymer. In particular embodiments, UV radiation may be used to polymerise and/or harden and/or set the exposed liquid (e.g. wet) photopolymer. The UV radiation may have a wavelength of about 200-400 nm and may have a specific wavelength matched to cure the photoinitiator being used (e.g. about 254 nm or 355 nm or 365 nm or 375 nm or 395 nm or 405 nm). The use of thin wet liquid photopolymer films allows low intensity radiation (e.g. UV light) to be used in the photoimaging process. The liquid wet photopolymer may be imaged and cured with a low power of about 0.5-2 mJ and typically about 1-2 mJ.

After the imaging from the first imaging unit the protective film may be removed by any means such as peeling.

The unexposed regions of the liquid wet film of photopolymer which remain uncured may be removed using, for example, a washing procedure.

The further radiation from the second imaging unit which cures the parts of the solder mask not covered by the cured part of the liquid wet photopolymer may be from any suitable light source such as a UV light source. In particular embodiments of the present invention, the radiation may be collimated to improve the quality and/or resolution and/or definition of the photoimaging process. The UV radiation may have a wavelength of about 200-400 nm. The cured part of the liquid wet photopolymer may therefore be seen as functioning as a photomask.

The uncured part of the solder mask may be removed via a further washing procedure.

The channels or traces located above or substantially above the pads may be in the form of high definition fine lines or tubes suitable for electrical circuitry. The fine lines or tubes may have a width or diameter of any of the following: less than or equal to about 200 µm; less than or equal to about 150 µm; less than or equal to about 140 µm; less than or equal to about 130 µǐΩ; less than or equal to about 120 µǐΩ; less than or equal to about 110 µǐΩ; less than or equal to about 100 µǐΩ; less than or equal to about 90 µǐΩ; less than or equal to about 80 µǐΩ; less than or equal to about 75 µǐΩ; less than or equal to about 70 µǐΩ; less than or equal to about 60 µǐΩ; less than or equal to about 50 µǐΩ; less than or equal to about 40 µǐΩ; less than or equal to about 30 µǐΩ; less than or equal to about 20 µǐΩ; less than or equal to about 10 µǐΩ; or less than or equal to about 5 µǐΩ. Alternatively the fine lines or tubes may have a width or diameter of any of the following: about 0.1-200 Mm; about 1-150 Mm; about 1-100 Mm; about 20-100 µm or about 5-75µιτι. The fine lines or tubes may be used in conjunction with PCBs and other electrical components.

The method of the present invention may also be self-contained in a mini-clean room which therefore provides significant cost savings in the photoimaging process as large industrial clean rooms are not required.

The present invention therefore has a number of advantages:

1. The process can be a continuous high speed process with no handling and therefore improved efficiency.
2. No clean room is required.
3. The process uses the minimum amount of time in an imaging unit thereby providing maximum utilisation.
4. Significant yield improvement.
5. Low power consumption.
6. Big energy savings as no heat used to pre-dry photopolymer.
7. Exposure is much faster due to exclusion of air at the surface of the wet liquid photopolymer because of the film protection. This results in very rapid throughput in a normally slow cycle direct imaging unit e.g. laser direct imaging (LDI) units. Laser direct imaging (LDI) units cost about £500 k-£1 m and time on them is costly.
8. Cost savings using liquid photopolymer compared to expensive dry films.
9. Due to thinness of liquid photopolymer (approx 5 microns) extremely fine detail can be printed. This favours laser imaging since operating at lower power (but quicker speeds) increases the accuracy of the image.

According to an eighth aspect of the present invention there is provided imaged substrates formed according to the first aspect.

The photoimaged substrates may be used to form photoimaged circuits.

Typically, the photoimaged circuits may be electrical circuits.

According to a ninth aspect of the present invention there is provided apparatus for imaging, said apparatus comprising:

a device capable of overlaying an exposed surface of a substrate and electrical components on the exposed surface of the substrate with a layer of solder mask;

a device capable of depositing a liquid wet photopolymer onto the layer of solder mask to form a layer of liquid wet film of photopolymer;

a device capable of applying a UV transparent or substantially UV transparent protective film onto the layer of liquid wet film of photopolymer;

a first imaging unit capable of imaging part of the liquid wet photopolymer through the protective film onto regions of the polymer located above or substantially above the electrical components wherein the exposed regions of the liquid wet photopolymer are cured and hardened;

a second imaging unit capable of curing the parts of the solder mask not covered by the cured part of the liquid wet photopolymer; and wherein channels or traces located above or substantially above the electrical components are capable of being formed.

The apparatus may be used to perform photoimaging process as defined previously.

The devices capable of overlaying the layer of solder mask and the liquid wet photopolymer may be any suitable means such as a spray, a brush, a roller and/or a dip coating system.

The first and second imaging units may be any suitable UV light sources.

Preferably, the imaging units may be direct imaging units such as a laser direct imaging (LDI) unit or any other suitable digital light imaging device.

BRIEF DESCRIPTION OF THE DRAWINGS

Embodiments of the present invention will now be described, by way of example only, with reference to the accompanying drawings in which:

FIG. 14 is sectional side view of exposed electrical components (e.g. pads) on a printed circuit board (PCB) according to an embodiment of the present invention;

FIG. 15 is a sectional side view of the printed circuit board (PCB) shown in FIG. 14 with a layer of solder mask deposited according to an embodiment of the present invention;

FIG. 16 is a sectional side view of the printed circuit board (PCB) shown in FIG. 15 with wet liquid photopolymer layer deposited according to an embodiment of the present invention;

FIG. 17 is a sectional side view of the printed circuit board (PCB) shown FIG. 16 with a transparent film layer deposited according to an embodiment of the present invention;

FIG. 18 is a sectional side view of the printed circuit board (PCB) shown in FIG. 17 ready to be exposed with a laser direct imaging unit (LDI) according to an embodiment of the present invention;

FIG. 19 is a sectional side view of the printed circuit board (PCB) shown in FIG. 18 after exposure with the laser direct imaging unit (LDI) according to an embodiment of the present invention;

FIG. 20 is a sectional side view of the printed circuit board (PCB) shown in FIG. 19 being exposed with UV radiation after exposure from the laser direct imaging unit (LDI) according to an embodiment of the present invention;

FIG. 21 is a sectional side view of the printed circuit board (PCB) shown in FIG. 20 which shows that the photopolymer cured with the laser direct imaging unit (LDI) acts as a photomask on the solder mask according to an embodiment of the present invention; and FIG. 22 is a sectional side view of the printed circuit board (PCB) shown in FIG. 21 where the photomask and unreacted solder mask has been stripped off according to an embodiment of the present invention.

BRIEF DESCRIPTION

Generally speaking, the present invention resides in the provision of an improved photoimaging process wherein a rotatable phototool is used. In the present invention photoimaging process there is also no pre-drying prior to the actual imaging process—this is in contrast to prior art processes. The improved photoimaging process is based on the principle that liquid photopolymer (i.e. printable ink which can be imaged and cured) is not pre-dried prior to imaging and a rotatable phototool is used which allows reel to reel continuous process to be used. The parts of the photopolymer which are imaged are hardened and can then be used to form electrical circuitry. The photopolymer which is unexposed remains in liquid form can then be washed off.

In the prior art there are many circuits made by reel to reel production methods. Flexible circuits lend themselves to this method. Increasingly, high outputs of printed circuitry are required for the 'printed electronics' market. Reel to reel production is ideally suited to longer runs (high volumes) of one part number. Using the principles of the present invention a web of material (e.g. polyester film with thin copper layer) may be coated with a liquid photopolymer by any means (e.g. a roller coater) and imaged by a phototool secured to the outside of a clear rotating drum which is illuminated from within by a radiation source (e.g. a UV light source which may be LEDs). The web would be held in close intimate contact with the rotatable phototool and the phototool would create a freshly exposed image with each revolution of the drum. This process will now be described in more detail below and referring to FIGS. 1 to 4.

Figure 1:
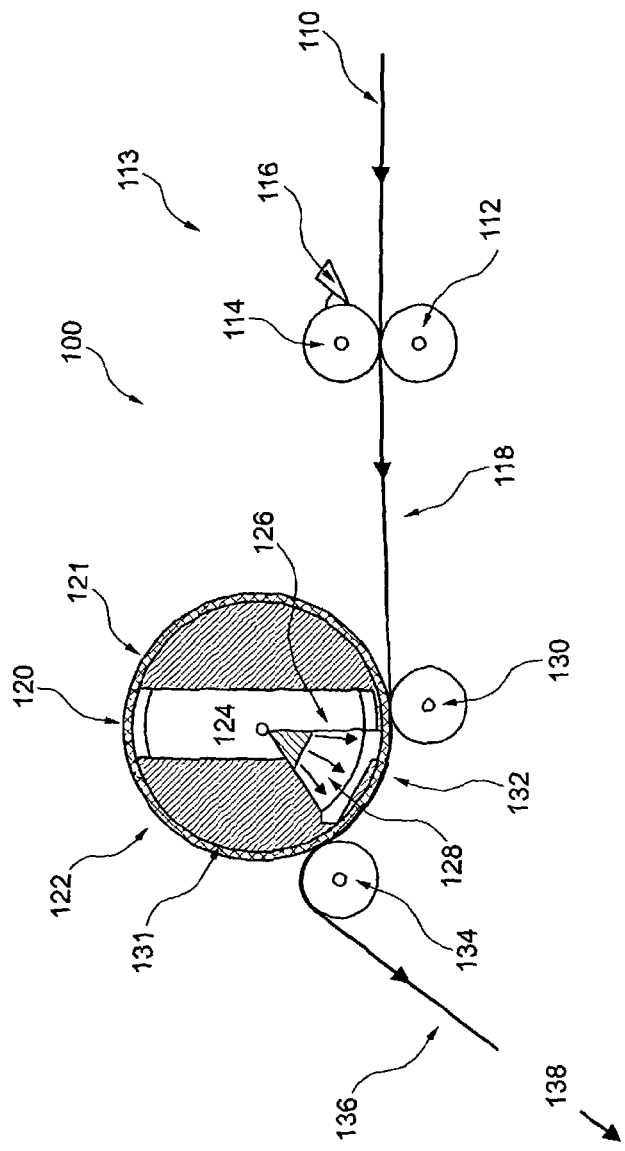
FIG. 1 is a representational side view of apparatus comprising a rotatable phototool according to the present invention.
Figure 2:
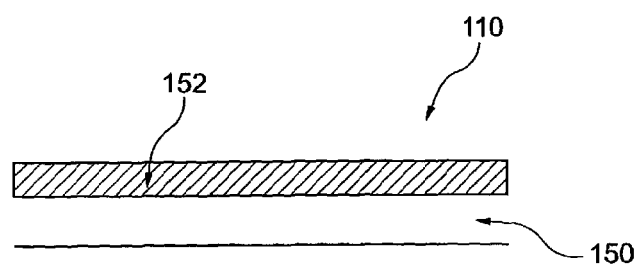
FIG. 2 is a sectional side view of a substrate according to an embodiment of the present invention.

FIG. 1 represents photoimaging apparatus according to the present invention generally designated 100. FIG. 1 shows that a substrate at point 110 (e.g. a web of material) is first of all fed in from the right-hand side. FIG. 2 is a sectional side view of the substrate at point 110. This shows that the substrate comprises a first layer 150 which may, for example, be a dielectric or non-metallic layer made from a plastics material such as polyester (e.g. Melinex—Trade Mark, polyimide (e.g. Kapton—Trade Mark) and polycarbonate (e.g. Lexan—Trade Mark). Above the first layer 150 there may be a cladding layer 152 which may, for example, be made from a conductive material such as copper, silver, gold and the like, or conductive polymers such as PDET, ITO or Graphene.

Figure 3:
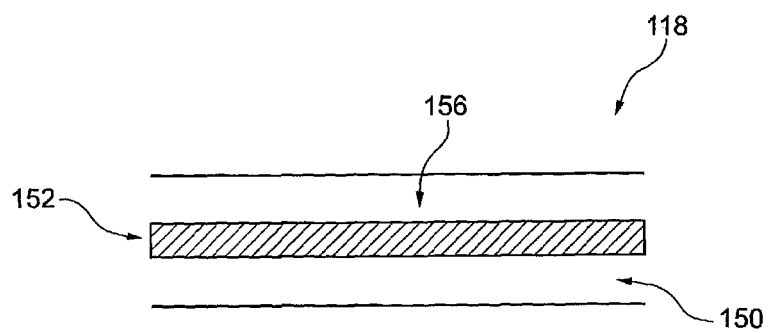
FIG. 3 is a sectional side view of the substrate shown in FIG. 2 with a wet photopolymer layer deposited thereon according to an embodiment of the present invention.

FIG. 1 shows the substrate being coated with a liquid photopolymer using a roller coating unit comprising roller 114 with impression roller 112 supporting the web. A doctor blade 116 controls the rate of deposition of the liquid photopolymer from the roller 114. The liquid photopolymer is deposited in a substantially even and continuous manner by the roller coating unit 113. However, the liquid photopolymer can be deposited using any other method such as using a spray, a brush, a roller and/or a dip coating system. FIG. 3 is a sectional view of the substrate at point 118 and shows that a thin layer 156 of liquid photopolymer has been deposited onto the substrate.

Figure 4:
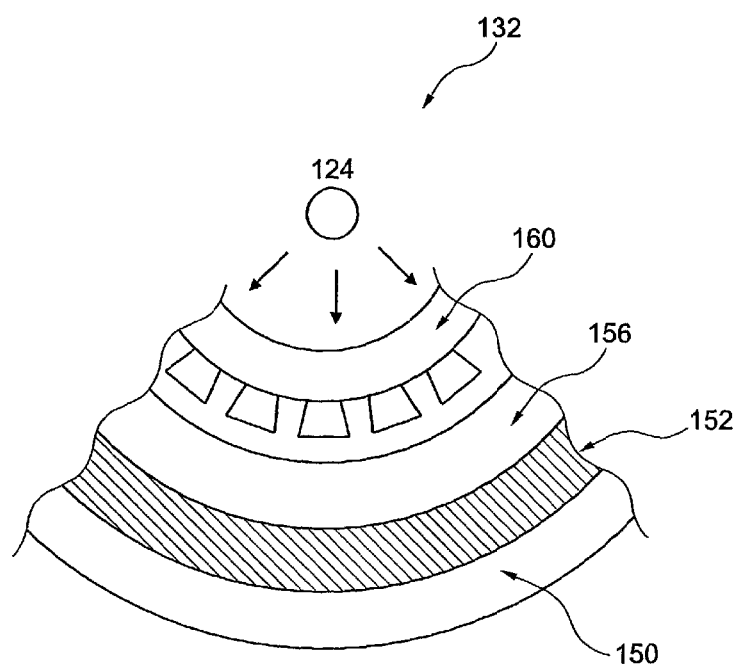
FIG. 4 is a sectional side view of the substrate shown in FIGS. 2 and 3 wherein a rotatable phototool is being used in a photoimaging process according to an embodiment of the present invention.

As shown in FIG. 1 the substrate then makes contact with roller 130 and is rolled against the outer surface 122 of a phototool 120. The phototool 120 extends around a UV transparent/translucent tubular structure 131 which may be made from, for example, glass (e.g. pyrex glass), quartz or any other suitable UV transparent/translucent material. The UV transparent/translucent tubular structure 131 may be coated with a protect/release coating. At the center of the UV transparent/translucent tubular structure 131 there is a UV light source 124 which emits UV light through the phototool 120 within the confines of an internal light baffle 126. The phototool 120 is tensioned using a tensioner 121. The phototool 120 creates an image during each revolution and can therefore be used to operate a continuous process. FIG. 4 shows the substrate at point 132 and the imaging part 160 of the phototool 120 being rolled against the thin layer 156 of liquid photopolymer on the substrate. The substrate is then imaged by the UV light source 124. The UV radiation has a wavelength of about 200-400 nm and has an intensity matched to cure the exposed liquid photopolymer layer. The photoimaging process is extremely quick as no air and therefore minimal oxygen is trapped under the liquid photopolymer layer. After curing the substrate then passes over roller 134 and at point 136 the substrate has a cured image and a residual wet coating (i.e. the area that is not imaged with UV light). After the photoimaging process, liquid photopolymer which has not been exposed to UV radiation is removed using, for example, an aqueous alkali solution via a washing procedure. A standard chemical etching process may then be used. For example, acid or alkali may be used to produce a dielectric substrate clad with the required metal (e.g. copper) circuitry covered by polymerised photopolymer. The polymerised photopolymer can then be removed to yield a substrate with the required electrical conductive circuitry.

The apparatus as described in the present invention can also be fully contained in a mini-clean room which therefore provides significant cost savings in the photoimaging process.

Using the method as described in the present invention high definition fine lines suitable for electrical circuitry are obtained. The fine lines have a width of any of the following: less than or equal to about 200 µm; less than or equal to about 150 µm; less than or equal to about 140 µm; less than or equal to about 130 µm; less than or equal to about 120 µm; less than or equal to about 110 µm; less than or equal to about 100 µm; less than or equal to about 90 µm; less than or equal to about 80 µm; less than or equal to about 75 µm; less than or equal to about 70 µm; less than or equal to about 60 µm; less than or equal to about 50 µm; less than or equal to about 40 µm; less than or equal to about 30 µm; less than or equal to about 20 µm; less than or equal to about 10 µm; or less than or equal to about 5 µm. Alternatively the fine lines have a width of any of the following: greater than about 200 µm; greater than about 150 m; greater than about 100 µm; greater than about 75 µm; greater than about 50 µm; greater than about 20 µm; or greater than about 10 µm. Alternatively the fine lines have a width of any of the following: about 0.1-200 µm; about 1-150 m; about 1-100 µm; about 20-100 µm or about 5-75 µm. Preferable, the fine lines have a width of about 5 microns.

The process in the present invention may be used to form a variety of electronic components including that of printed circuit boards (PCBs), flat panel displays and flexible circuits suitable for manufacture within the electronics market.

Although not shown the apparatus 100 may comprise multiple coating heads and rotating drums.

Figure 5:
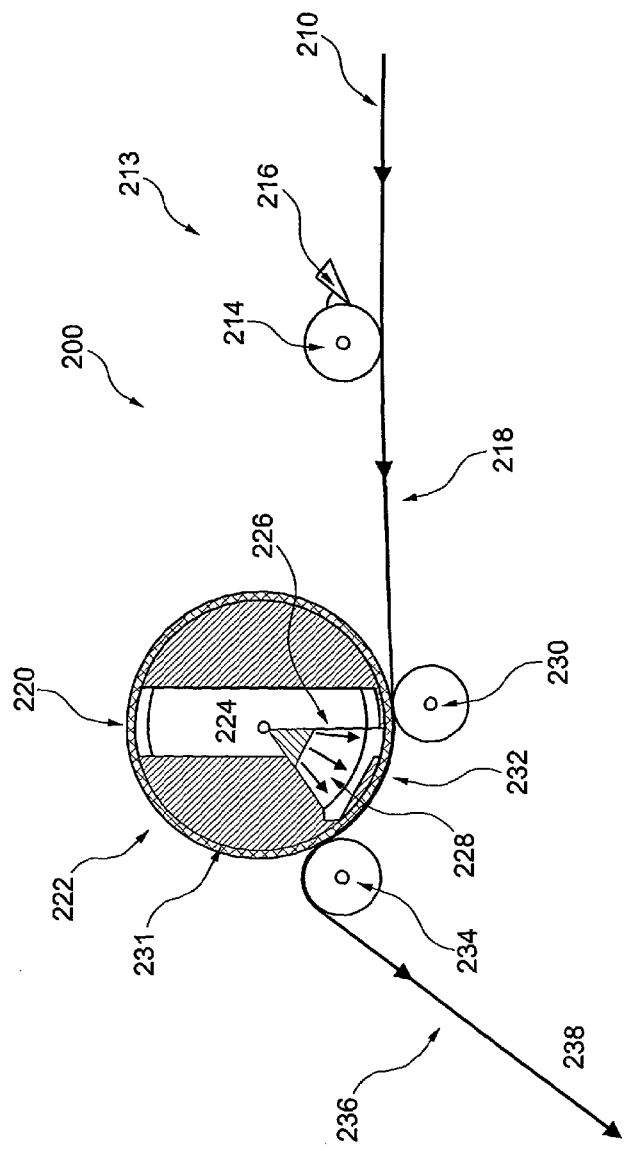
FIG. 5 is a representational side view of apparatus comprising a rotatable phototool according to a further embodiment of the present invention.

FIG. 5 is a representation of a further photoimaging apparatus according to the present invention generally designated 200. The apparatus 200 is similar to the apparatus 100 shown in FIG. 1 with a few differences. FIG. 5 shows that there is a substrate 210 (e.g. a web of material) that is fed in from the right-hand side of the apparatus 200. As previously described the substrate 210 may be comprise a first layer which may, for example, be a dielectric or non-metallic layer made from a plastics material such as polyester (e.g. Melinex—Trade Mark, polyimide (e.g. Kapton—Trade Mark) and polycarbonate (e.g. Lexan—Trade Mark). Above the first layer there may be a cladding layer which may, for example, be made from a conductive material such as copper, silver, gold and the like or conductive polymers such as PDET, ITO or Graphene.

FIG. 5 shows that the substrate 210 is coated with a liquid photopolymer to form a coated substrate 218 using a roller coating unit 213 comprising a roller 214. In contrast to the apparatus 100 shown in FIG. 1, the apparatus 200 only has one coating roller 214. A UV ink duct 216 controls the rate of deposition of the liquid photopolymer from the roller 214. The liquid photopolymer is deposited in a substantially even and continuous manner by the roller coating unit 213. The roller 214 can be a flexo/screen/letterpress/gravure roller. However, the liquid photopolymer can be deposited using any other method such as using a spray, a brush, a roller and/or a dip coating system.

Figure 6:
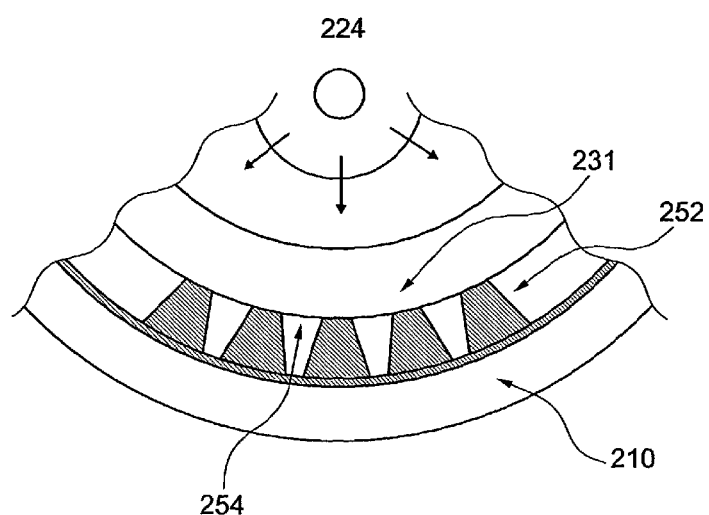
FIG. 6 is a sectional side view of the substrate shown in FIG. 5 wherein a rotatable phototool is being used in a photoimaging process according to an embodiment of the present invention.

FIG. 5 then shows that the coated substrate 218 then makes contact with tension roller 230 and is rolled against the outer surface 222 of a phototool 220. The phototool 220 extends around a UV transparent/translucent tubular structure 231 which may be made from, for example, glass (e.g. pyrex glass), quartz or any other suitable UV transparent/translucent material. The UV transparent/translucent tubular structure 231 may be coated with a protect/release coating. At the center of the UV transparent/translucent tubular structure 231 there is a UV light source 224 which emits UV light onto the phototool 220 within the confines of an internal light baffle 226. The phototool 220 creates an image during each revolution and can therefore be used to operate a continuous process. FIG. 5 therefore shows the coated substrate 218 is imaged by the UV light source 224 between rollers 230 and 234 which rolls the coated substrate 218 against the outside surface of the phototool 224 and hence expose the liquid photopolymer on the substrate 210 to the UV radiation. During this process the liquid photopolymer on the substrate 210 is pressed against the outside surface of the phototool which ensures that there is no air and therefore oxygen between the liquid photopolymer being exposed and the UV radiation. FIG. 6 is an expanded view of the curing process. This shows the UV light source 224 radiating light towards and through the UV transparent/translucent tubular structure 231 onto the UV ink 252 on top of the substrate 210 which prints an image. An important aspect to note is that air and therefore oxygen is excluded in the area in tight contact between the ink sandwiched between the UV transparent/translucent tubular structure 231 and the substrate 210.

The UV radiation has a wavelength of about 200-400 nm and has an intensity matched to cure the exposed liquid photopolymer layer. The photoimaging process is extremely quick as no air and oxygen is trapped under the liquid photopolymer layer. After curing the substrate then passes over roller 234 and at point 236 the substrate 210 has a cured image and a residual wet coating (i.e. the area that is not imaged with UV light) and can then be fed into a further print unit 238. After the photoimaging process, liquid photopolymer which has not been exposed to UV radiation is removed using, for example, an aqueous alkali solution via a washing procedure. A chemical etching process may then be used. For example, acid or alkali may be used to produce a dielectric substrate clad with the required metal (e.g. copper) circuitry covered by polymerised photopolymer. The polymerised photopolymer can then be removed to yield a substrate with the required electrical conductive circuitry.

The present invention also resides in the provision of an improved imaging process wherein direct imaging is used and where no phototool is required. In the present imaging process there is also no pre-drying process prior to the actual imaging process—this is in contrast to prior art processes. The improved imaging process is based on the principle that liquid wet photopolymer (i.e. printable ink which can be imaged and cured) is not pre-dried prior to imaging and is located (i.e. sandwiched) between an upper and lower UV transparent (or substantially UV transparent) film. The liquid wet photopolymer is imaged using a direct writing process such as any suitable light imaging device e.g. a laser direct imaging (LDI) unit or any other suitable digital light imaging device. The parts of the photopolymer which are imaged are hardened and can then be used (e.g. as an etch resist) or seeding layer) to form electrical circuitry. The film can then be removed and re-used. The photopolymer which is unexposed remains in liquid form can then be washed off. One or both sides of a substrate are capable of being imaged using this process. This process will now be described in more detail below and referring to FIGS. 1 to 6.

Figure 7:
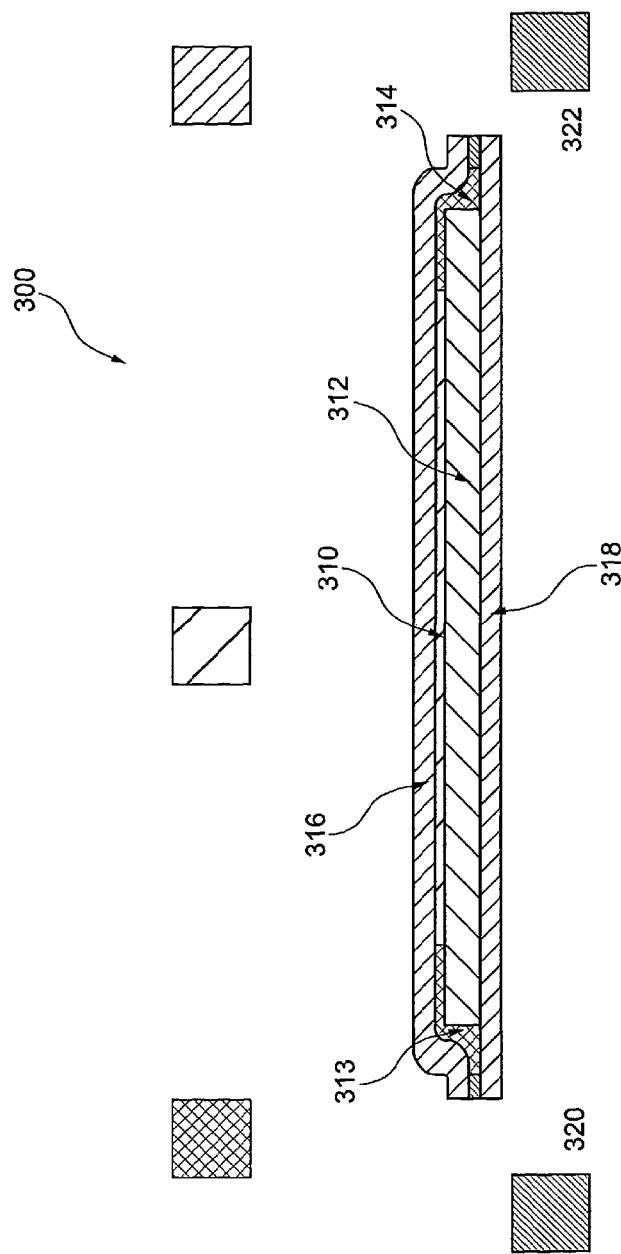
FIG. 7 is sectional side view of a substrate in a pre-exposed mode and ready to be imaged according to an embodiment of the present invention.

FIG. 7 is a representation of the wet photopolymer pouch of the present invention generally designated 300. The wet photopolymer pouch 300 has a wet liquid photopolymer layer 310. The wet liquid photopolymer is preferably made up of 100% solids and contains no solvents. The thickness of the wet liquid photopolymer layer 310 may, for example, be less than about 178 µm (0.007 inch) and in this particular embodiment is about 5 microns. The wet liquid photopolymer layer 310 is not pre-dried prior to photoimaging. There is also shown a layer 312 which extends below the wet liquid photopolymer layer 310. The layer 312 is a substrate material capable of being imaged and, for example, is made of conductive material such as copper, silver, gold and the like, or non metallic conductors such as PEDOT, ITO or Graphene or even dielectric material.

Above the wet liquid photopolymer layer 310 there is a clear UV transparent filmic material layer 316 which is, for example, polyester. The films used in the present invention may be coated with a protective coating to aid chemical resistance, release from cured photopolymer and dimensional changes caused by excess humidity levels. Located below the layer 312 there is another clear filmic layer 318 which is, for example, polyester. As shown at both ends of the wet photopolymer pouch 100 there are areas of sealed cured photopolymer 313, 314 which have been exposed to radiation and cured resulting in some regions of film to film lamination 320, 322.

Figure 8:
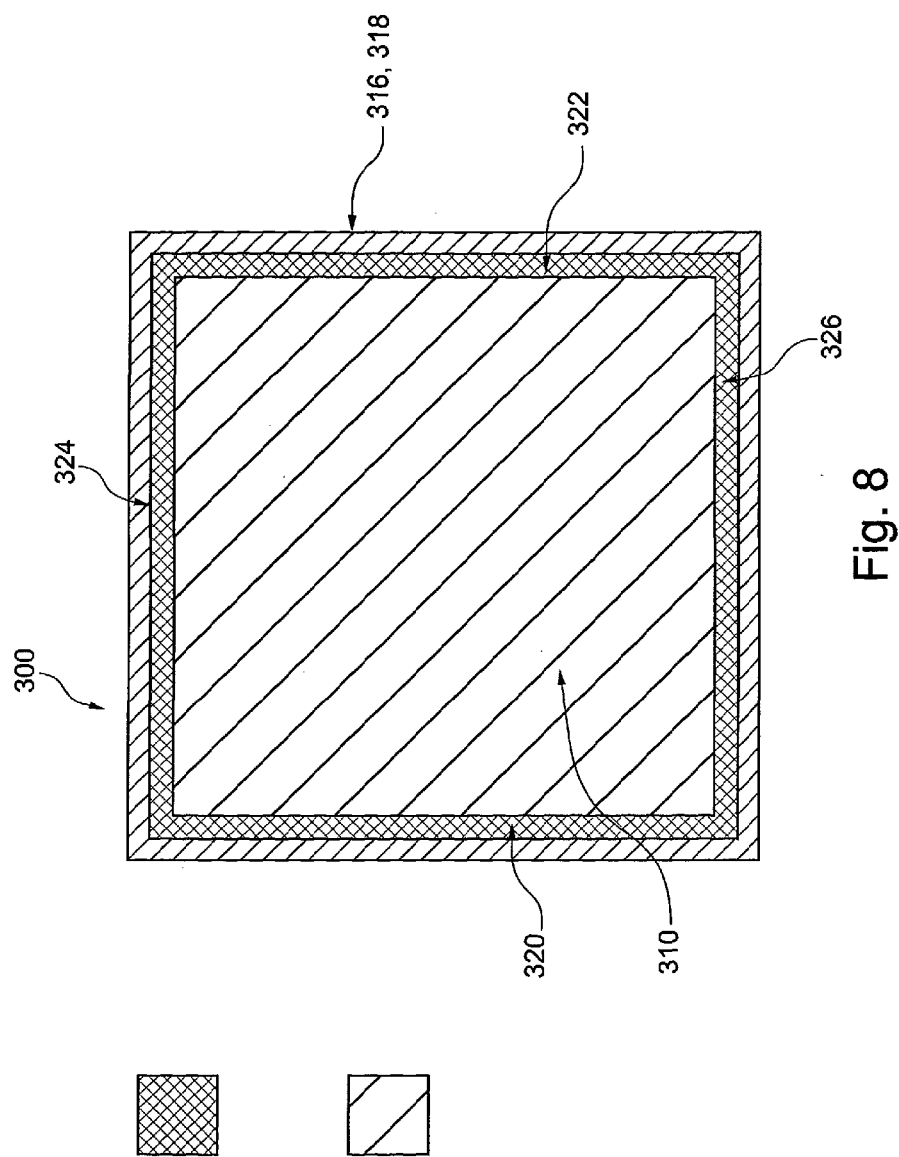
FIG. 8 is a top plan view of the substrate shown in FIG. 7 in a pre-exposed mode and ready to be imaged.

FIG. 8 is a top view of the wet photopolymer pouch 300. Located in the middle of the wet photopolymer pouch there is the wet liquid photopolymer layer 310 which is not cured. Around the edges of the wet photopolymer pouch 300 there is shown sealed edges 320, 322, 324, 326 i.e. borders. The edges have a sealed width of about 12-15 mm. The wet liquid photopolymer layer 310 may therefore be seen as being enclosed and sealed in a pouch or envelope ready for photoimaging at a later stage of the process. The wet liquid photopolymer layer 310 is therefore sandwiched between the layers 316, 318. The sealed edges 320, 322, 324, 326 are created in a pre-exposure stage with the wet photopolymer pouch 300 being supported on both upper and lower surfaces by a clear (or substantially clear) film layer of, for example, polyester. As the uncured wet liquid photopolymer layer 310 is sealed this has the advantage of keeping the uncured wet liquid photopolymer protected and clean. As the photopolymer is wet this also allows for quicker exposure as wet photopolymer images faster than cured photopolymer. The film which forms the layers 316, 318 also has the advantage in that it as it is laid down onto the wet photopolymer it contacts intimately against the wet photopolymer and therefore removes (i.e. squeezes out) any air (including oxygen) adjacent the photopolymer which can be detrimental to the photoimaging process. Obviously, during the deposition of the layers 316, 318 onto the wet photopolymer there should be no air bubbles formed. The film forming the layers 316, 318 may also be reused.

Figure 9:
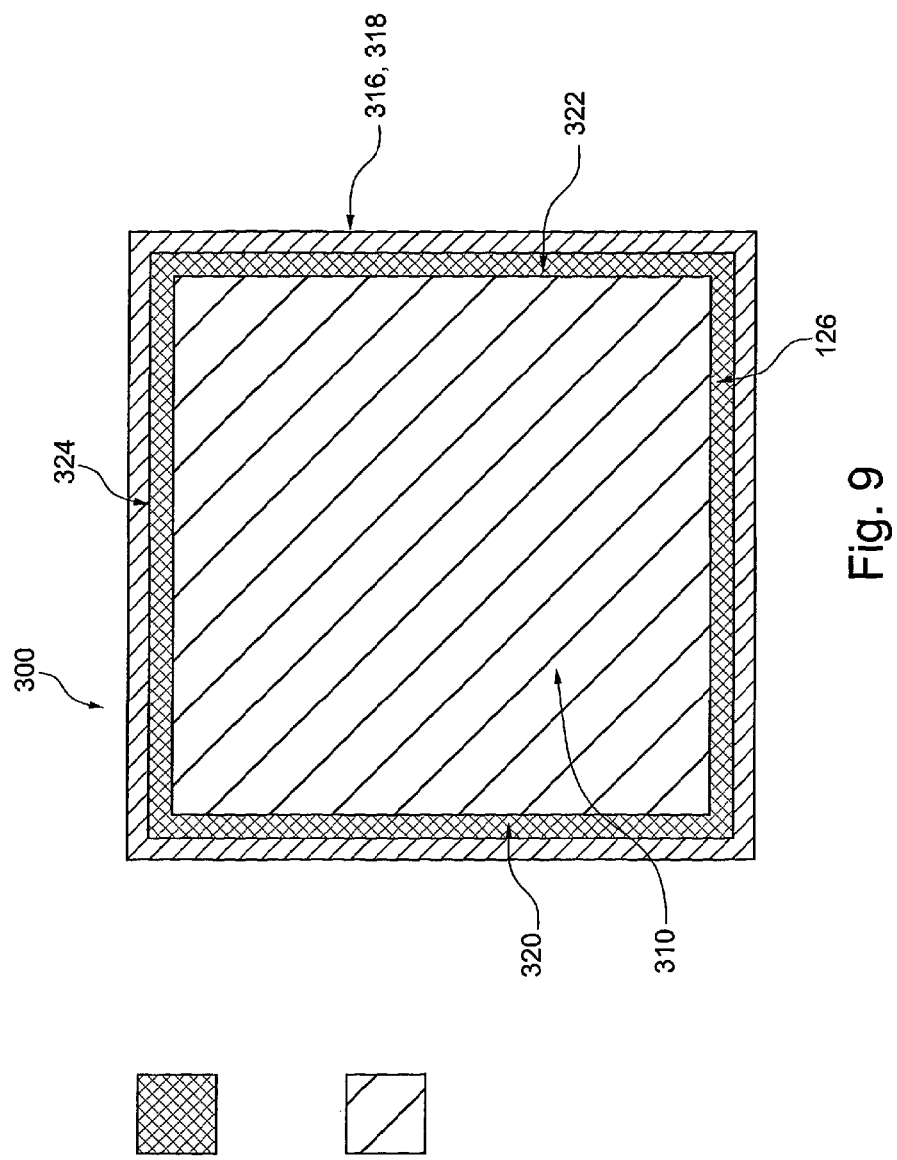
FIG. 9 is a further top plan view of the substrate shown in FIGS. 7 and 8 illustrating where imaging by direct laser imaging will occur.

FIG. 9 is a view of the wet photopolymer pouch 300 showing where the imaging (i.e. writing) may occur in the wet liquid photopolymer layer 310. The wet liquid photopolymer layer 310 may be photo-imaged to any suitable or required pattern. As shown in FIG. 9 the image writing may occur through about 5-6 microns of wet photopolymer with a low power of about 1.8 mJ which allows for a faster writing speed and greater detail as compared with prior art processes.

Figure 10:
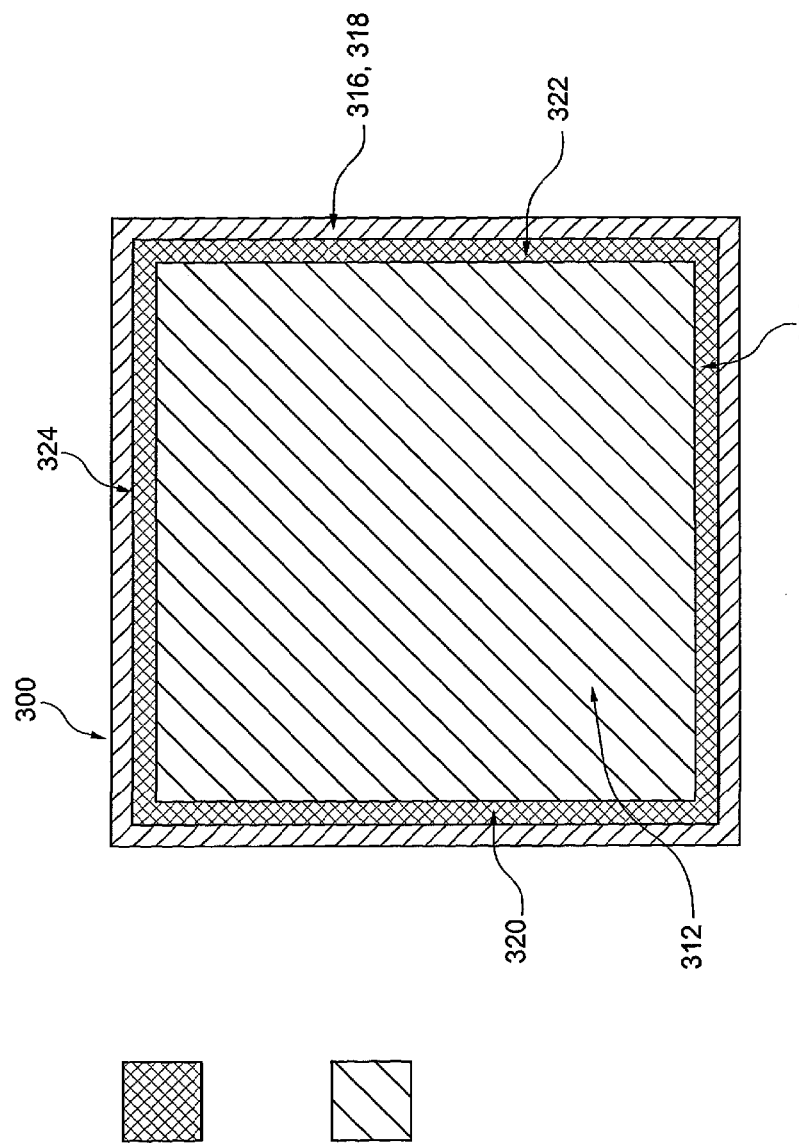
FIG. 10 is a yet further top plan view of the substrate shown in FIGS. 7 to 9 and a further stage in the process where the directly written image is developed in carbonate solution.

FIG. 10 is a view of the next stage in the photoimaging process where after imaging the image can be developed in developing solution such as a carbonate solution. The layers of film 316, 318 may then be removed and wet photopolymer which has not been imaged and hardened may then be washed away.

Figure 11:
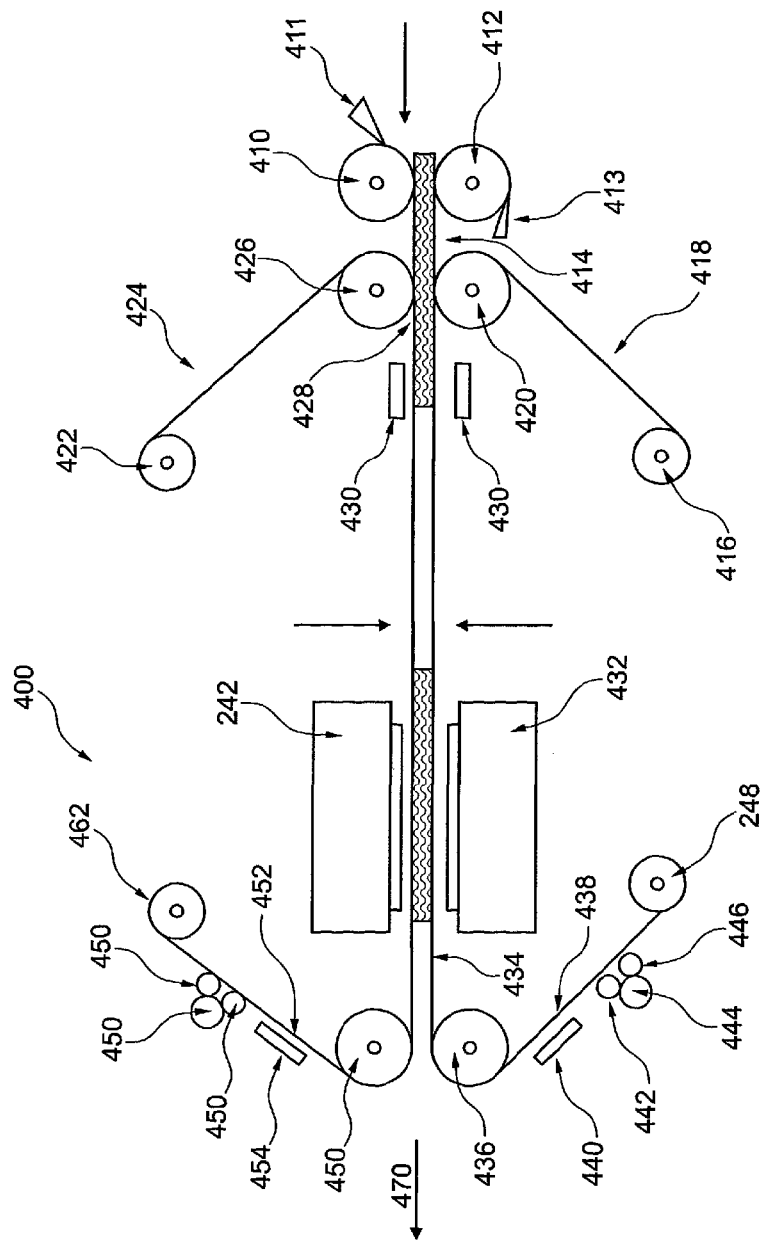
FIG. 11 is a representational side view of a reel to reel imaging apparatus according to an embodiment of the present invention.

FIG. 11 is a representation of reel to reel imaging apparatus according to the present invention generally designated 400. On the right-hand side of the apparatus there is a series of rollers 410, 412, 420, 426 which are capable of moving a substrate 414 along the length of the apparatus 400. The substrate 414 has first of all been cleaned in a cleaner unit (not shown). The rollers 410, 412 deposit wet liquid photopolymer onto a substrate 414, for example, a copper panel. Doctor blades 411, 413 may be used to control the feed and thickness of deposited wet liquid photopolymer.

Figure 12:
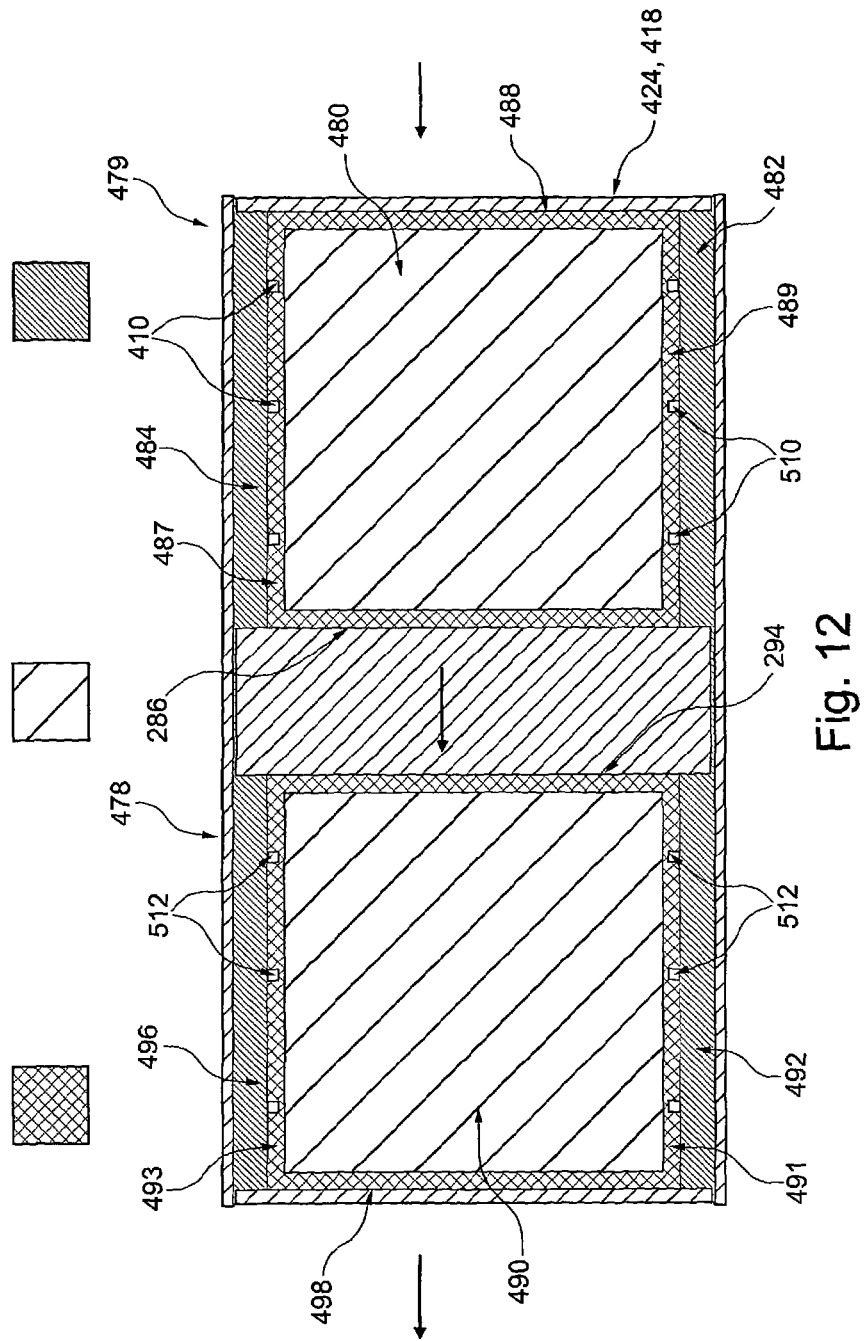
FIG. 12 is a top plan view of two substrates ready to be imaged and which are formed using the reel to reel imaging apparatus shown in FIG. 11.

The rollers 420, 426 are used to deposit film layers 418, 424 (e.g. polyester film) onto the liquid wet photopolymer. Other rollers 416, 422 are used to feed the film 418, 424 onto rollers 420, 426. At the point 428 shown in FIG. 11 the substrate panel 414 therefore has an uncured wet liquid photopolymer layer sandwiched between two film layers 418, 424. There is then shown a border exposure unit with two radiation sources 430, 432 which forms the sealed borders around an uncured wet photopolymer layer to create a wet photopolymer pouch. FIG. 12 shows that this can form a series of sealed wet photopolymer pouches 478, 479. Pouch 478 has sealed edges 286, 487, 488, 489 along with sealed film areas 482, 484. Pouch 479 has sealed edges 491, 493, 494, 498 along with sealed film areas 492, 496. Each of the wet photopolymer pouches 478, 479 also has an uncured central region 480, 490, respectively. FIG. 12 also shows that there are unexposed regions 510 and 512 in the substrates 414, 428, respectively. These unexposed regions 510 and 512 (sometimes referred to as 'mouse' bites) may be used to form electrical connections.

Returning to FIG. 11 wet pouch 428 with its cured edges 491, 493, 494, 498 is then passed into an exposure apparatus which has an upper exposure unit 430 and a lower exposure unit 432. The upper and lower exposure units 430, 432 are direct imaging units meaning that there is no photoimaging mask (i.e. the imaging is maskless). The exposure units 430, 432 may be laser direct imaging units that write directly onto the unexposed regions 410 and 412 in the wet photopolymer pouches 478, 479, respectively.

The exposed wet photopolymer pouches 428 then moves along to area 434 in the apparatus 400 away from the exposure apparatus. There is then a series of further rollers 450, 456, 458, 460, 462 located on the upper part of the apparatus 400 and a series of rollers 436, 442, 444, 446, 448 on the lower part of the apparatus 400 which may be used to remove the films 418, 424. There is also UV post dry and cleaner units 440, 454 which can be used to clean and dry the removed film. Finally, the exposed and imaged substrate 470 with the film removed is then passed to a developer unit (not shown).

The process in the present invention may be used to form a variety of electronic components including that of printed circuit boards (PCBs), flat panel displays and flexible circuits.

The present direct imaging process therefore uses an optically UV transparent clear film to locate uncured liquid wet photopolymer within a cured frame over a substrate (e.g. panel) to be imaged. The exposure in the present invention is remarkably quick and uses low levels of UV energy compared with standard resists. In prior art standard resists (including other imageable layers like solder mask) require typically 50-80 mJ of energy to complete the exposure (cross-linking). Some expensive dry films have been developed with exposure requirements as low as 8 mJ. By contrast the liquid wet photopolymer of the present invention can be exposed with only about 1.8 mJ of UV energy. The significance of this needs to be understood in terms of the improved productivity from direct imaging units (e.g. laser direct imaging units). The use of a direct imaging process also allows for small adjustments of the panel intended to be imaged to be moved slightly so that all imaged panels are exactly the same with no distortions caused by the stretching of the base substrate in a phototool. This cannot be achieved with standard lithographic systems.

Figure 13:
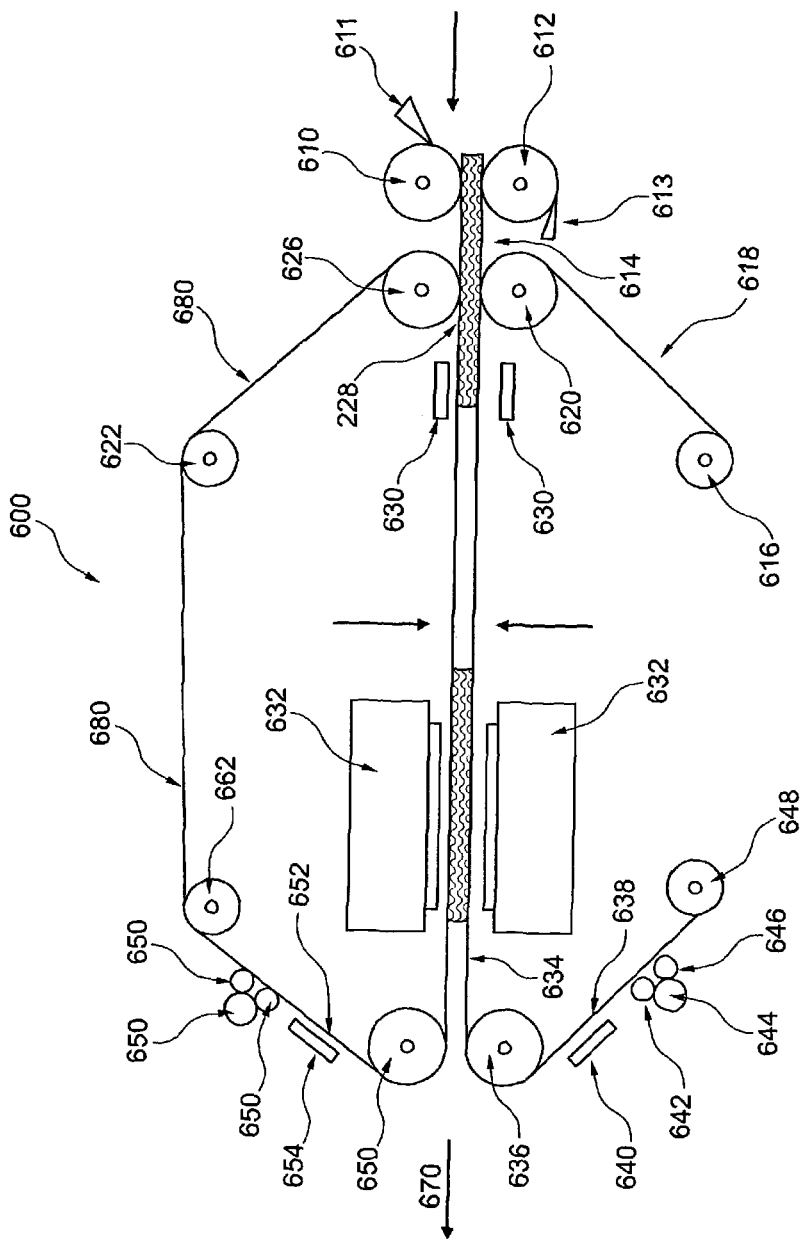
FIG. 13 is a top plan view of two substrates ready to be imaged and which are formed using a continuous imaging apparatus.

FIG. 13 is an apparatus 600 which using a continuous imaging process.

The present invention also resides in the provision of an improved imaging process wherein at least part of a solder mask on a printed circuit board (PCB) is exposed using a first imaging stage (e.g. with a laser direct imaging unit) wherein a wet liquid photopolymer layer is cured and thereafter a further imaging step occurs to create an image above the solder mask. The present invention therefore relies on the deposition of a wet liquid photopolymer layer on top of a solder mask layer and then initially imaging the wet liquid photopolymer layer wherein the solder mask below is not imaged until a later imaging stage.

FIG. 14 is a view of a substrate 710 (e.g. a printed circuit board) which is substantially flat and planar. On one side of the substrate 710 there is a series of exposed electrical components 712 (e.g. pads) which protrude from the surface of the substrate 710.

FIG. 15 shows the first stage of the process where a layer of solder mask 714 is deposited with a thickness of about 20 μm. The solder mask is standard solder mask and is therefore a layer of polymer which is usually used to provide a permanent protective coating for copper traces in a printed circuit board (PCB). The solder mask may therefore be made from an epoxy liquid. Once the material forming the solder mask is deposited on the substrate 710 and the electrical components 712, solvent is driven off the solder mask material so that a dry layer of solder mask 714 is formed. The solder mask 714 is deposited using any suitable technique such as spraying, brushing, dip coating and/or using a roller or even lamination with a dry film.

FIG. 16 then shows that on top of the dry layer of solder mask 714 a wet liquid layer of photopolymer 716 is deposited using any suitable technique such as spraying, brushing, dip coating and/or using a roller. The wet liquid layer of photopolymer 716 is UV curable and is deposited with a thickness of about 5 microns. It should be noted that the photopolymer 716 is kept wet with no curing at this stage. The present invention therefore relates to a method of photoimaging a substrate covered with a wet liquid curable photopolymer (i.e. a wet photopolymer). In contrast to many prior art techniques, the present invention therefore relates to the use of wet films rather than expensive dry films such as Riston (Trade Mark). Dry films are considerably more expensive than the use of wet films. The use of wet films also overcomes the need for pre-drying of the wet films and therefore leads to a very controllable process. As will be explained below the wet liquid layer of photopolymer 716 ends up functioning as a 'resident' phototool.

As shown in FIG. 17 the next stage in the process is to apply a protective film 118 on top of the wet liquid layer of photopolymer 716. The film 718 is made of any suitable material but particularly may be made from polyester which may be UV transparent or translucent. Optionally, the film may also be optically or substantially optically clear. The film also optionally comprises a protective coating to aid chemical resistance, release from cured photopolymer and dimensional changes caused by excess humidity levels. In alternative embodiments, an inert blanket such as nitrogen, argon or carbon dioxide may be used in place of the film 718.

FIG. 18 then shows a laser direct imaging (LDI) print head 720 located above an electrical component 712. The laser direct imaging (LDI) print head 720 will therefore cure a region 722 located below. This can occur several times or there can be a series of print heads 720 to cure the region above the electrical components 712 as shown in FIG. 18. The laser direct imaging (LDI) print head 720 does not require a photomask and only images that part of the wet liquid layer of photopolymer 716 below the print head 720 and uses laser radiation such as UV radiation.

FIG. 19 shows that after the irradiation by the laser direct imaging (LDI) print head 720, the protective film 718 is removed and the uncured part of the wet liquid layer of photopolymer 716 that remains wet is washed off with a standard washing procedure. This leaves the cured and hardened parts 722 of the wet liquid layer of photopolymer 716.

The next stage in the process is shown in FIG. 20 where collimated UV light 723 from a UV light source (not shown) in a second imaging step is directed onto the top of the cured regions 722 of the wet liquid layer of photopolymer 716 and onto the exposed parts of the solder mask 714.

FIG. 21 shows that the areas underneath the cured parts 722 of the wet liquid layer of photopolymer 716 therefore act as a photomask to the solder mask layer 714 below and that the areas 724 of the solder mask below the cured parts 722 of the wet liquid layer of photopolymer 716 are protected and not exposed to the collimated UV light 723.

Finally, FIG. 22 shows that the cured parts 722 of the wet liquid layer of photopolymer 716 and the unreacted parts 724 of the solder mask layer 714 are removed. Stripping is carried out using a wash off procedure with an aqueous and/or a solvent based chemistry solution. After this removal channels 726 are formed between regions of cured solder mask 728. At the bottom of the formed channels are the electrical components 712. The channels or traces located above or substantially above the pads may be in the form of high definition fine lines or tubes suitable for electrical circuitry.

The advantages of this method are that a printed circuit board manufacturer can now effectively image their solder mask at high speeds in a laser direct imaging unit (LDI) thus playing to all the strengths of the laser's accuracy whilst minimising time in an operating machine. The same approach can be used for any thick coating (ink, photoreactive polymer) which requires to be imaged using UV light.

Whilst specific embodiments of the present invention have been described above, it will be appreciated that departures from the described embodiments may still fall within the scope of the present invention. For example, any suitable type of imageable substrate may be used. Moreover, any suitable liquid photopolymer or combinations thereof may be used. The curing radiation used may be of any appropriate wavelength which is capable of curing the wet liquid photopolymer.

The invention claimed is:

1. A method for imaging a substrate, said method comprising:
providing a substrate;
depositing a liquid wet photopolymer onto at least part of the substrate to form a layer of liquid wet film of photopolymer on the substrate;
applying a protective film onto the layer of liquid wet film of photopolymer on the substrate;
providing a direct imaging unit; and
directly applying radiation from the direct imaging unit onto the liquid wet photopolymer through the protective film;
wherein an imaged pattern of cured photopolymer is formed on the substrate.

2. The method of claim 1, wherein there is no pre-drying step before the film of wet photopolymer is imaged and irradiated with, for example, UV radiation.

3. The method of claim 1, wherein no phototool is used in the photoimaging of the liquid wet photopolymer;
wherein the substrate comprises first and second sides, and liquid wet photopolymer is deposited onto one or both of said first and second sides of the substrate;
wherein the substrate is made from or comprises flexible material and is made of a conductive material, non-metallic material, or a dielectric material; and
wherein the liquid wet photopolymer is in the form of a thin film on one or both sides of the substrate and is imaged directly with one or two direct imaging units.

4. The method of claim 3, wherein the substrate is made from copper, silver, gold, or a conducting polymer.

5. The method of claim 4, wherein the conducting polymer is PDET, ITO or Graphene.

6. The method of claim 1, wherein the wet liquid photopolymer is imaged with a low power of about 0.5-2 mJ, about 1-2 mJ or about 1.8 mJ;
wherein the radiation used to cure the wet liquid photopolymer is of any suitable radiation which cures the liquid photopolymer such as laser emitted UV radiation;
wherein the radiation used to cure the wet liquid photopolymer has a wavelength of about 200-400 nm;
wherein after imaging, the image is developed in developing solution such as a carbonate solution, the layers of film are removed and wet photopolymer which has not been imaged and hardened is washed away;
wherein the wet liquid photopolymer is deposited using any suitable technique to only one or both first and second sides of the substrate;
wherein the wet liquid photopolymer is deposited using a series of rollers and therefore allowing the formation of the imaged substrate to occur in a reel to reel process; and
wherein prior to application of the wet liquid photopolymer, the substrate is cleaned using a contact cleaning process to remove debris and/or contamination from the surface of the substrate.

7. The method of claim 6, wherein the radiation used to cure the wet liquid photopolymer is UV light with a wavelength of about 355 nm, about 365 nm, about 375 nm, about 385 nm, about 395 nm or about 405 nm.

8. The method of claim 6, wherein the wet liquid photopolymer is deposited to only one or to both sides of the substrate using a spray, brush, roller and/or a dip coating system.

9. The method of claim 1, wherein the wet liquid photopolymer is deposited with a thickness according to any of the following: less than or equal to about 150 µm; less than or equal to about 125 µm; less than or equal to about 100 µm; less than or equal to about 75 µm; less than or equal to about 50 µm; less than or equal to about 25 µm; less than or equal to about 10 µm; less than or equal to about 5 µm; less than or equal to about 1 µm; less than or equal to about 0.5 µm or less than or equal to about 0.1 µm; or
wherein the liquid photopolymer is deposited with a thickness ranging from any of the following: about 177 µm to about 0.1 µm; about 125 µm to about 0.1 µm; about 100 µm to about 0.1 µm; about 75 µm to about 0.1 µm; about 50 µm to about 0.1 µm; about 25 µm to about 0.1 µm or about 10 µm to about 0.1 µm.

10. The method of claim 1, wherein the protective film is of any suitable material such as a polyester film which is optically or substantially optically clear and transparent to UV radiation;
wherein the protective film comprises a protective coating to aid chemical resistance, release from cured photopolymer and dimensional changes caused by excess humidity levels; and
wherein the method is used to form an electronic component.

11. The method of claim 10, wherein the electronic components are selected from the group consisting of printed circuit boards (PCBs), flat panel displays and flexible circuits.

12. The method of claim 1, wherein high definition fine lines suitable for electrical circuitry are capable of being obtained having a width of any of the following: less than or equal to about 200 µm; less than or equal to about 150 µm; less than or equal to about 140 µm; less than or equal to about 130 µm; less than or equal to about 120 µm; less than or equal to about 110 µm; less than or equal to about 100 µm; less than or equal to about 90 µm; less than or equal to about 80 µm; less than or equal to about 75 µm; less than or equal to about 70 µm; less than or equal to about 60 µm; less than or equal to about 50 µm; less than or equal to about 40 µm; less than or equal to about 30 µm; less than or equal to about 20 µm; less than or equal to about 10 µm; or less than or equal to about 5 µm; or
- wherein high definition fine lines suitable for electrical circuitry are capable of being obtained having a width of any of the following: about 0.1-200 µm; about 1-150 µm; about 1-100 µm; about 20-100 µm or about 5-75 µm.

13. The method of claim 1, wherein all steps such as the deposition of the liquid photopolymer, the deposition and removal of the protective film occur in a single pass through the apparatus.

14. The method of claim 1, wherein the method is performed using an apparatus comprising:
- a) a device capable of depositing liquid wet photopolymer onto a surface of the substrate to form a film of liquid wet photopolymer;
- b) a means capable of delivering a protective film onto the film of liquid wet photopolymer; and
- c) a direct imaging unit capable of applying radiation onto the liquid wet photopolymer and forming an imaged pattern of cured photopolymer on the substrate.

15. The method of claim 14, wherein the device capable of depositing liquid wet photopolymer onto a surface of the substrate to form a film of liquid wet photopolymer is in the form of a roller with optionally a doctor blade to control the rate of photopolymer deposition.

16. The method of claim 15, wherein the direct imaging unit is a laser direct imaging (LDI) unit or any other suitable digital light imaging device.

17. The method of claim 15, wherein the apparatus further comprises a pre-exposure radiation unit to perform a curing step which forms a frame, border and/or perimeter of cured photopolymer around a region of uncured liquid wet photopolymer;
- wherein the pre-exposure radiation unit comprises light emitting diodes (LEDs); or
- wherein the apparatus allows a continuous reel to reel process to occur where the protective film is delivered in a reel form onto the liquid wet photopolymer and then removed once the imaging has occurred.

18. A method for imaging a substrate, said method comprising:
- providing a substrate;
- depositing a liquid wet photopolymer onto at least part of the substrate to form a layer of liquid wet film of photopolymer on the substrate;
- applying a protective film onto the layer of liquid wet film of photopolymer on the substrate;
- providing a direct imaging unit; and
- directly applying radiation from the direct imaging unit onto the liquid wet photopolymer through the protective film;
- wherein an imaged pattern of cured photopolymer is formed on the substrate,
- wherein the direct imaging unit is a direct writing process using any suitable light imaging device;
- wherein parts of the liquid wet photopolymer which are imaged are hardened and are then capable of being used to form, for example, electrical circuitry;
- wherein once the imaging has occurred, the protective film on one or both sides of the substrate is then removed and photopolymer which is unexposed remains in liquid form is washed off;
- wherein one or both sides of the substrate are therefore capable of being photoimaged;
- wherein prior to the imaging of the liquid wet photopolymer in the direct writing process and after the deposition of the film or films onto the liquid wet photopolymer there is an intermediate process where a curing process occurs which forms a frame, border and/or perimeter of cured photopolymer around a region of uncured liquid wet photopolymer;
- wherein the uncured liquid wet photopolymer is sealed within the frame of outer cured photopolymer to form a sealed panel and during the sealing process the protective film is sealed to the cured photopolymer;
- wherein the sealed panel is a single discrete unit or a series of sealed panels which are capable of being formed using a continuous reel of clear protective film which provides a sealed packet and a method of moving the panel along in a conveyor style;
- wherein the sealed frame, border and/or perimeter of cured photopolymer is formed during a pre-exposure stage using any suitable radiation source that is capable of curing the liquid wet photopolymer and forming a pouch of uncured liquid wet photopolymer; and
- wherein the sealed frame, border and/or perimeter of cured photopolymer is formed using light emitting diodes (LEDs).

19. The method of claim 18, wherein the light imaging device is a laser direct imaging (LDI) unit or any other suitable digital light imaging device.

20. The method of claim 18, wherein the sealed panel is a single mobile panel or pouch.

21. The method of claim 18, wherein the clear protective film is a polyester film.

22. An imaged substrate formed according to method claim 1.

23. An imaged substrate according to claim 12, wherein the photoimaged substrate is capable of being used in the manufacture of PCBs, flat panel displays and flexible circuits.

24. An apparatus for imaging a substrate, said apparatus comprising:
- a device capable of depositing liquid wet photopolymer onto a surface of the substrate to form a film of liquid wet photopolymer;
- a means capable of delivering a protective film onto the film of liquid wet photopolymer;
- a direct imaging unit capable of applying radiation onto the liquid wet photopolymer and forming an imaged pattern of cured photopolymer on the substrate.

25. An apparatus according to claim 24, wherein the device capable of depositing liquid wet photopolymer onto a surface of the substrate to form a film of liquid wet photopolymer is in the form of a roller, which optionally comprises a doctor blade, to control the rate of photopolymer deposition;
- wherein the devices comprises a series of rollers to deposit a film of liquid wet photopolymer onto the substrate; or
- wherein the direct imaging unit is a laser direct imaging (LDI) unit or any other suitable digital light imaging device.

26. An apparatus according to claim 24,
wherein the apparatus comprises a further series of rollers to remove the protective film after exposure,
wherein the apparatus further comprises a pre-exposure radiation unit to perform a curing step which forms a frame, border and/or perimeter of cured photopolymer around a region of uncured liquid wet photopolymer;
wherein the pre-exposure radiation unit comprises light emitting diodes (LEDs); or
wherein the apparatus allows a continuous reel to reel process to occur where the protective film is delivered in a reel form onto the liquid wet photopolymer and then removed once the imaging has occurred.

\* \* \* \* \*